(12) United States Patent
Lee et al.

(10) Patent No.: US 11,961,732 B2
(45) Date of Patent: *Apr. 16, 2024

(54) CONTROLLING THRESHOLD VOLTAGES THROUGH BLOCKING LAYERS

(71) Applicant: Taiwan Semiconductor Manufacturing Co., Ltd., Hsinchu (TW)

(72) Inventors: Chia-Ching Lee, New Taipei (TW); Chung-Chiang Wu, Taichung (TW); Shih-Hang Chiu, Taichung (TW); Hsuan-Yu Tung, Keelung (TW); Da-Yuan Lee, Jhubei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/814,716

(22) Filed: Jul. 25, 2022

(65) Prior Publication Data

US 2022/0359193 A1 Nov. 10, 2022

Related U.S. Application Data

(63) Continuation of application No. 16/571,944, filed on Sep. 16, 2019, now Pat. No. 11,430,652.

(51) Int. Cl.
*H01L 21/02* (2006.01)
*H01L 21/768* (2006.01)
(Continued)

(52) U.S. Cl.
CPC .. *H01L 21/02175* (2013.01); *H01L 21/76841* (2013.01); *H01L 21/76871* (2013.01); *H01L 27/0886* (2013.01); *H01L 29/66871* (2013.01)

(58) Field of Classification Search
CPC ......... H01L 23/53223; H01L 23/53238; H01L 23/53266; H01L 23/53252;
(Continued)

(56) References Cited

U.S. PATENT DOCUMENTS 9,449,830 B2    9/2016  Kang
9,496,361 B1 *  11/2016 Tung ............... H01L 21/823842
(Continued)

FOREIGN PATENT DOCUMENTS

DE    102017124635 A1    5/2018
KR    20150093384 A      8/2015
(Continued)

*Primary Examiner* — Michael Carter
*Assistant Examiner* — Lawrence C Tynes, Jr.
(74) *Attorney, Agent, or Firm* — Slater Matsil, LLP

(57) ABSTRACT

A method includes depositing a first work-function layer and a second work-function layer in a first device region and a second device region, respectively, and depositing a first fluorine-blocking layer and a second fluorine-blocking layer in the first device region and the second device region, respectively. The first fluorine-blocking layer is over the first work-function layer, and the second fluorine-blocking layer is over the second work-function layer. The method further includes removing the second fluorine-blocking layer, and forming a first metal-filling layer over the first fluorine-blocking layer, and a second metal-filling layer over the second work-function layer.

20 Claims, 30 Drawing Sheets

(51) Int. Cl.
*H01L 27/088* (2006.01)
*H01L 29/66* (2006.01)

(58) Field of Classification Search
CPC ......... H01L 21/76841; H01L 21/76876; H01L 21/02362; H01L 21/28079; H01L 21/28088; H01L 21/32051; H01L 21/32053; H01L 21/28097; H01L 2221/1073; H01L 2221/1089; H01L 29/435; H01L 29/495; H01L 29/4958; H01L 29/4966; H01L 29/4975; H01L 29/7813; H01L 29/7825; H01L 29/66734
See application file for complete search history.

(56) References Cited

U.S. PATENT DOCUMENTS

| | | | | |
|---|---|---|---|---|
| 10,049,940 | B1* | 8/2018 | Chen | H01L 21/823842 |
| 10,204,828 | B1* | 2/2019 | Bao | H01L 23/528 |
| 10,269,569 | B2 | 4/2019 | Tsai et al. | |
| 10,804,163 | B2* | 10/2020 | Lee | H01L 21/28176 |
| 10,879,370 | B2 | 12/2020 | Lim et al. | |
| 11,018,234 | B2* | 5/2021 | Hsieh | H01L 27/0886 |
| 11,289,578 | B2* | 3/2022 | Lee | H01L 21/32135 |
| 11,430,652 | B2* | 8/2022 | Lee | H01L 29/66545 |
| 2003/0157797 | A1* | 8/2003 | Herner | H01L 21/76843 |
| | | | | 438/653 |
| 2012/0230086 | A1 | 9/2012 | Chiu et al. | |
| 2014/0008720 | A1* | 1/2014 | Xie | H01L 29/4966 |
| | | | | 438/587 |
| 2014/0103404 | A1* | 4/2014 | Li | H01L 29/66545 |
| | | | | 257/288 |
| 2014/0299939 | A1* | 10/2014 | Kim | H01L 21/02697 |
| | | | | 257/369 |
| 2014/0319614 | A1* | 10/2014 | Paul | H01L 29/785 |
| | | | | 257/365 |
| 2016/0351569 | A1 | 12/2016 | Song et al. | |
| 2017/0040220 | A1 | 2/2017 | Kim et al. | |
| 2017/0077256 | A1* | 3/2017 | Adusumilli | H01L 29/4966 |
| 2017/0117190 | A1* | 4/2017 | Chung | H01L 29/4966 |
| 2017/0125548 | A1* | 5/2017 | Hung | H01L 29/66545 |
| 2017/0162575 | A1* | 6/2017 | Li | H01L 29/517 |
| 2017/0194209 | A1* | 7/2017 | Li | H01L 21/823456 |
| 2017/0301545 | A1* | 10/2017 | Li | H01L 21/76895 |
| 2019/0273024 | A1* | 9/2019 | Li | H01L 23/53209 |
| 2019/0273145 | A1* | 9/2019 | Chiu | H01L 21/28088 |
| 2020/0395310 | A1* | 12/2020 | Mukae | H01L 27/11565 |

FOREIGN PATENT DOCUMENTS

| | | |
|---|---|---|
| KR | 20160139814 A | 12/2016 |
| KR | 20180061071 A | 6/2018 |
| KR | 20180069673 A | 6/2018 |

* cited by examiner

CONTROLLING THRESHOLD VOLTAGES THROUGH BLOCKING LAYERS

PRIORITY CLAIM AND CROSS-REFERENCE

This application is a continuation of U.S. patent application Ser. No. 16/571,944, entitled "Controlling Threshold Voltages Through Blocking Layers," filed on Sep. 16, 2019, which application is incorporated herein by reference.

BACKGROUND

Metal-Oxide-Semiconductor (MOS) devices typically include metal gates, which are formed to solve poly-depletion effect in conventional polysilicon gates. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

A metal gate may include a plurality of layers to meet the requirements of the NMOS devices and PMOS devices. The formation of metal gates typically involves depositing a plurality of metal layers, forming a filling metal region with tungsten, and then performing Chemical Mechanical Polish (CMP) to remove excess portions of the metal layers. The remaining portions of the metal layers form metal gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
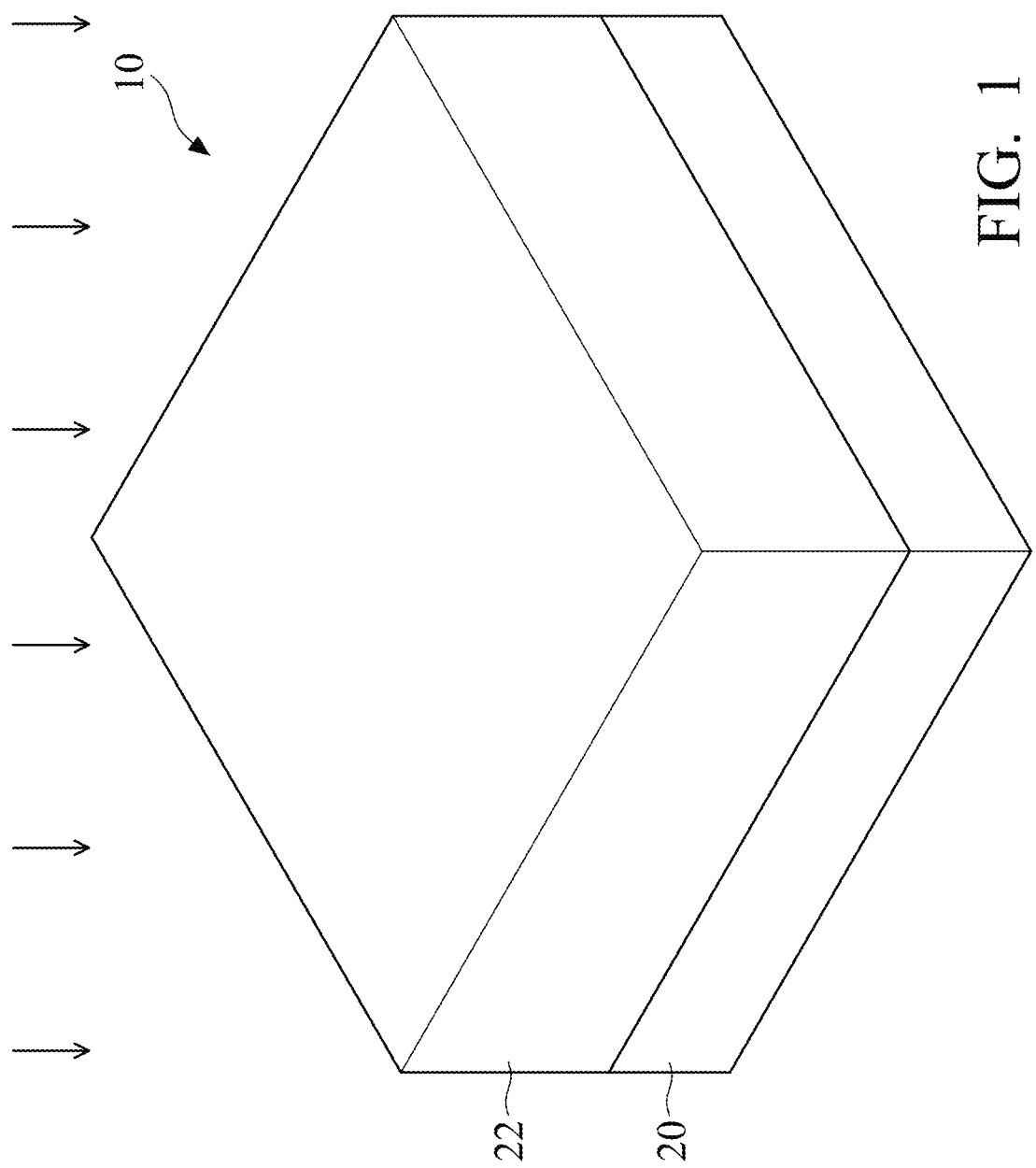
FIGS. 1-6, 7A, 7B, 8A, 8B, 9-15, 16A, and 16B illustrate the perspective views and cross-sectional views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors with replacement gates and the methods of forming the same are provided in accordance with some embodiments. The intermediate stages of forming the transistors are illustrated in accordance with some embodiments. Some variations of some embodiments are discussed. Throughout the various views and illustrative embodiments, like reference numbers are used to designate like elements. In the illustrated embodiments, the formation of Fin Field-Effect Transistors (FinFETs) is used as an example to explain the concept of the present disclosure. Planar transistors may also adopt the concept of the present disclosure. In accordance with some embodiments of the present disclosure, a fluorine-blocking layer is used to block fluorine from being diffused from fluorine-containing metal regions into an underlying work-function layer of a shorter channel transistor. Fluorine, when diffused into work-function layer, has the effect of causing the increase in the threshold voltage of the corresponding transistor. Longer-channel transistors have lower threshold voltages than short channel transistors due to geometry effect, and hence blocking fluorine from diffusing into their work function layers may cause their threshold voltages to be lower than the values for maintaining their normal operations. Accordingly, in longer-channel transistors, the fluorine blocking layer is either not formed, or formed with a reduced thickness than the fluorine blocking layer of the shorter-channel transistor, so that the threshold voltages of the longer channel transistors are increased by the incorporated fluorine.

FIGS. 1-6, 7A, 7B, 8A, 8B, 9-15, 16A, and 16B illustrate the cross-sectional views and perspective views of intermediate stages in the formation of Fin Field-Effect Transistors (FinFETs) in accordance with some embodiments of the present disclosure. The processes shown in these figures are also reflected schematically in the process flow 400 shown in FIG. 26.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 27:
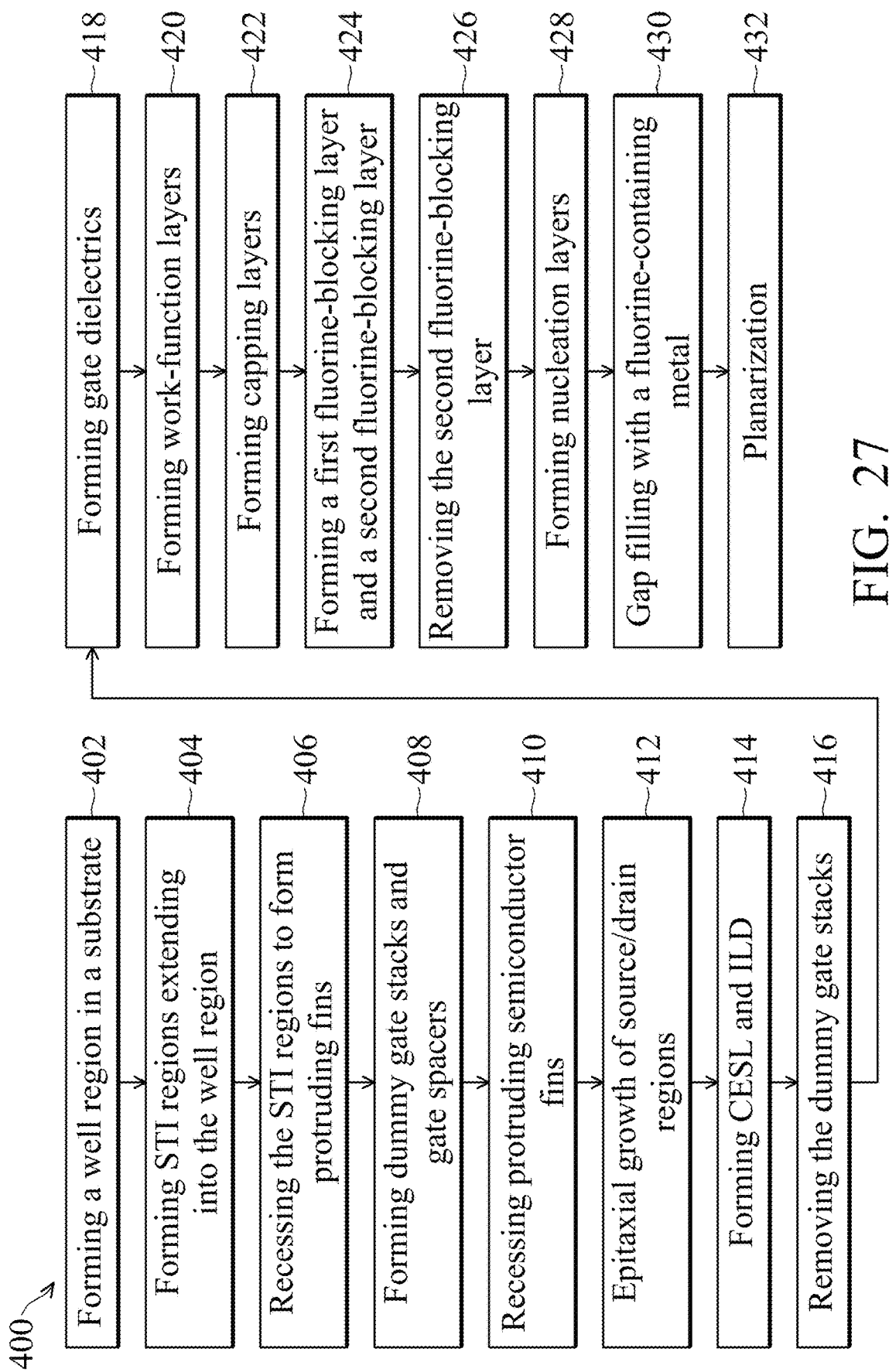
FIG. 27 illustrates a process flow for forming FinFETs in accordance with some embodiments.

Further referring to FIG. 1, well region 22 is formed in substrate 20. The respective process is illustrated as process 402 in the process flow 400 shown in FIG. 27. In accordance with some embodiments of the present disclosure, well region 22 is a p-type well region formed through implanting a p-type impurity, which may be boron, indium, or the like, into substrate 20. In accordance with other embodiments of the present disclosure, well region 22 is an n-type well region formed through implanting an n-type impurity, which may be phosphorus, arsenic, antimony, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
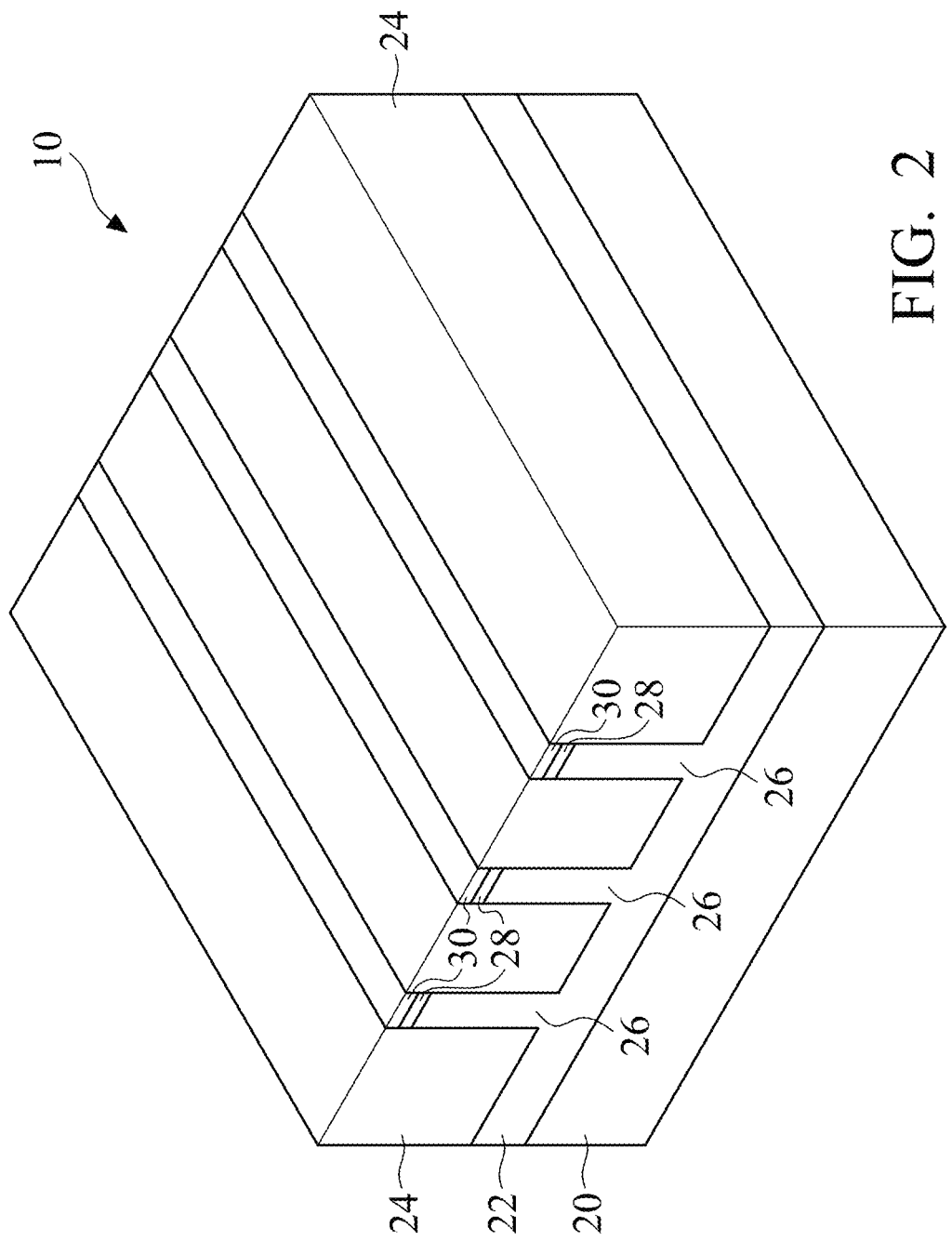

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 404 in the process flow 400 shown in FIG. 27. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitridation of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner dielectric, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
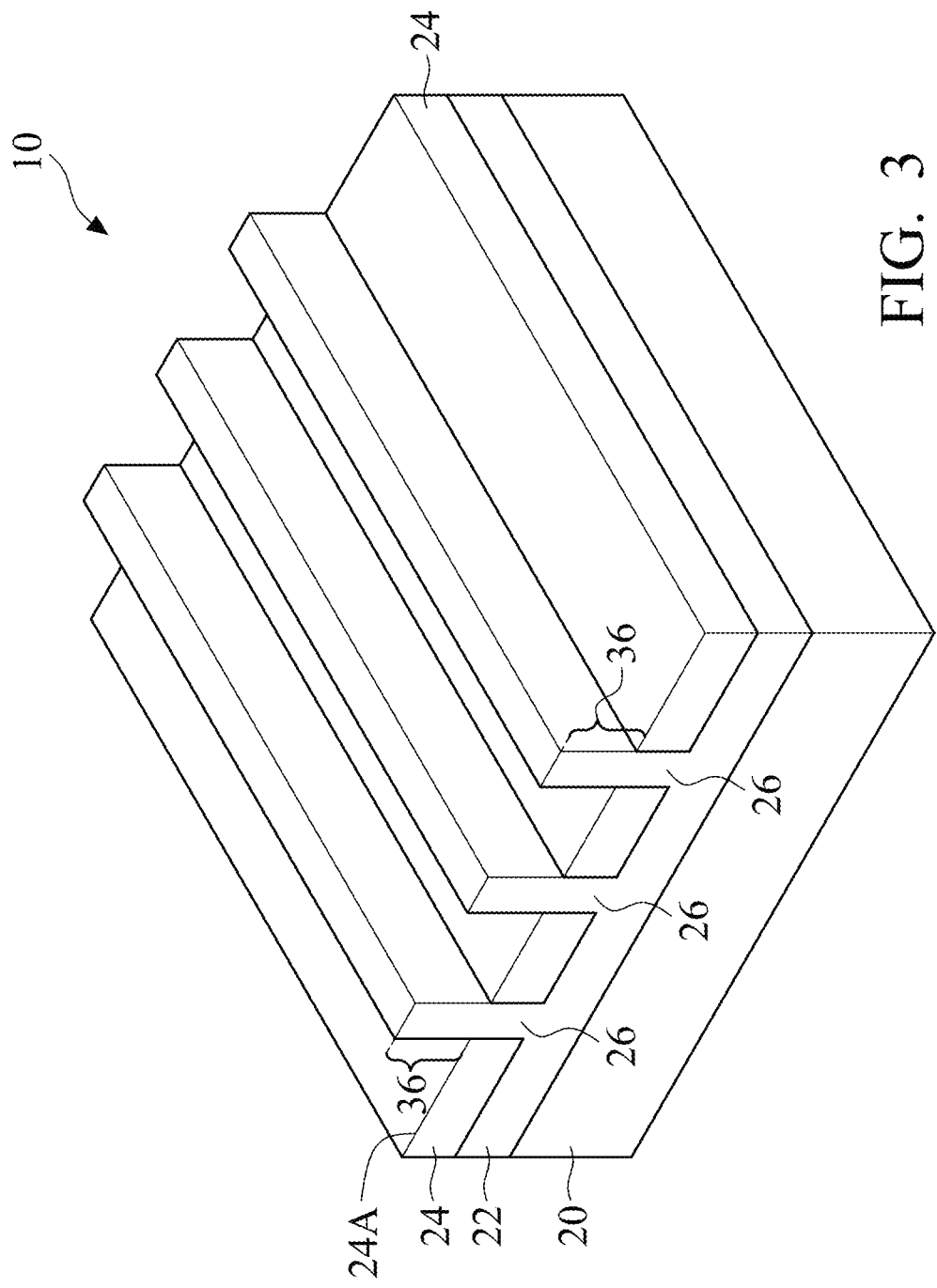

Referring to FIG. 3, STI regions 24 are recessed, so that the top portions of semiconductor strips 26 protrude higher than the top surfaces 24A of the remaining portions of STI regions 24 to form protruding fins 36. The respective process is illustrated as process 406 in the process flow 400 shown in FIG. 27. The etching may be performed using a dry etching process, wherein HF$_3$ and NH$_3$, for example, are used as the etching gases. During the etching process, plasma may be generated. Argon may also be included. In accordance with alternative embodiments of the present disclosure, the recessing of STI regions 24 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
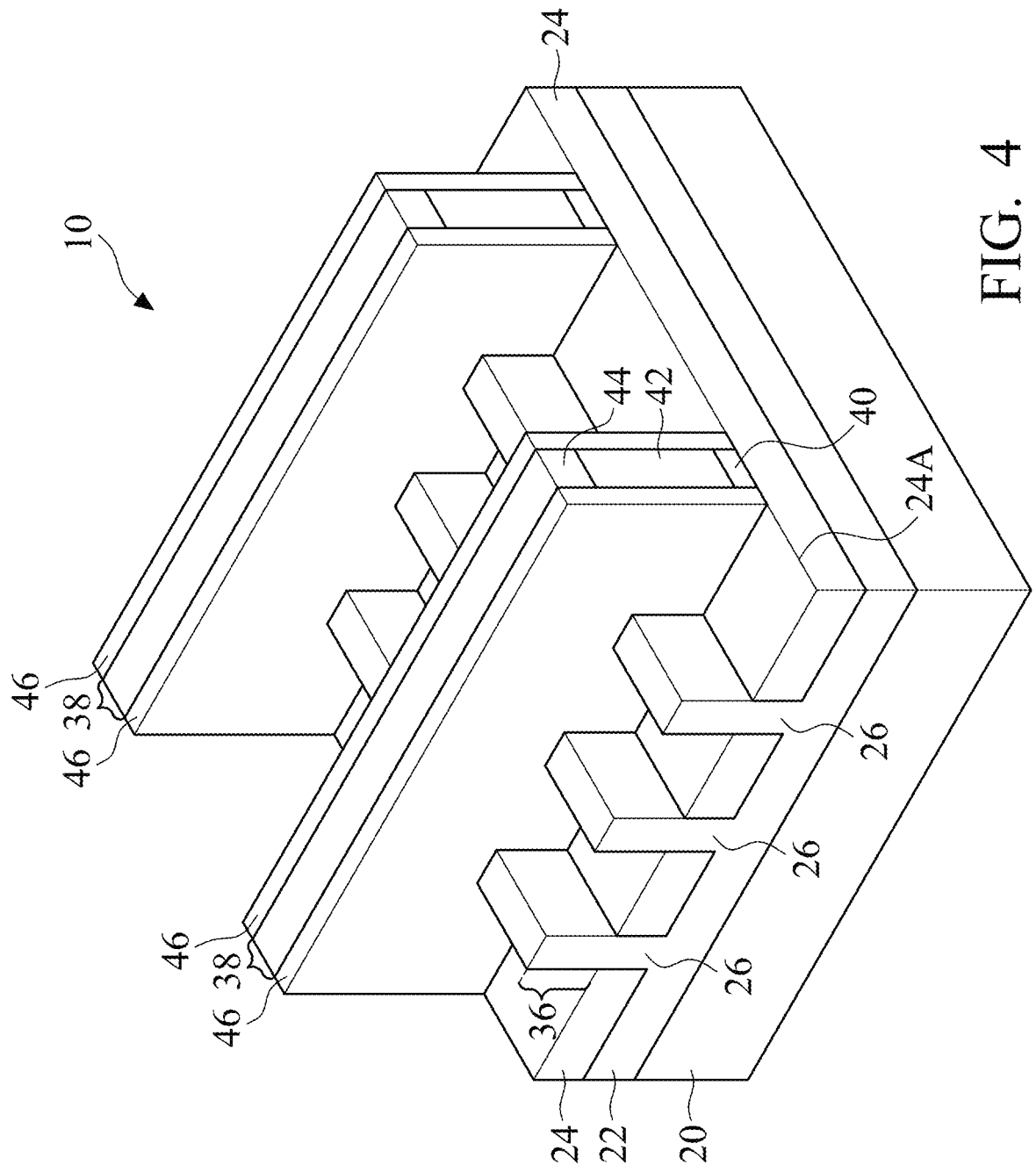

Referring to FIG. 4, dummy gate stacks 38 are formed to extend on the top surfaces and the sidewalls of (protruding) fins 36. The respective process is illustrated as process 408 in the process flow 400 shown in FIG. 27. Dummy gate stacks 38 may include dummy gate dielectrics 40 and dummy gate electrodes 42 over dummy gate dielectrics 40. Dummy gate electrodes 42 may be formed, for example, using polysilicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24. Dummy gate stacks 38 also have lengthwise directions perpendicular to the lengthwise directions of protruding fins 36.

Next, gate spacers 46 are formed on the sidewalls of dummy gate stacks 38. The respective process is also shown as process 408 in the process flow 400 shown in FIG. 27. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers.

Figure 5:
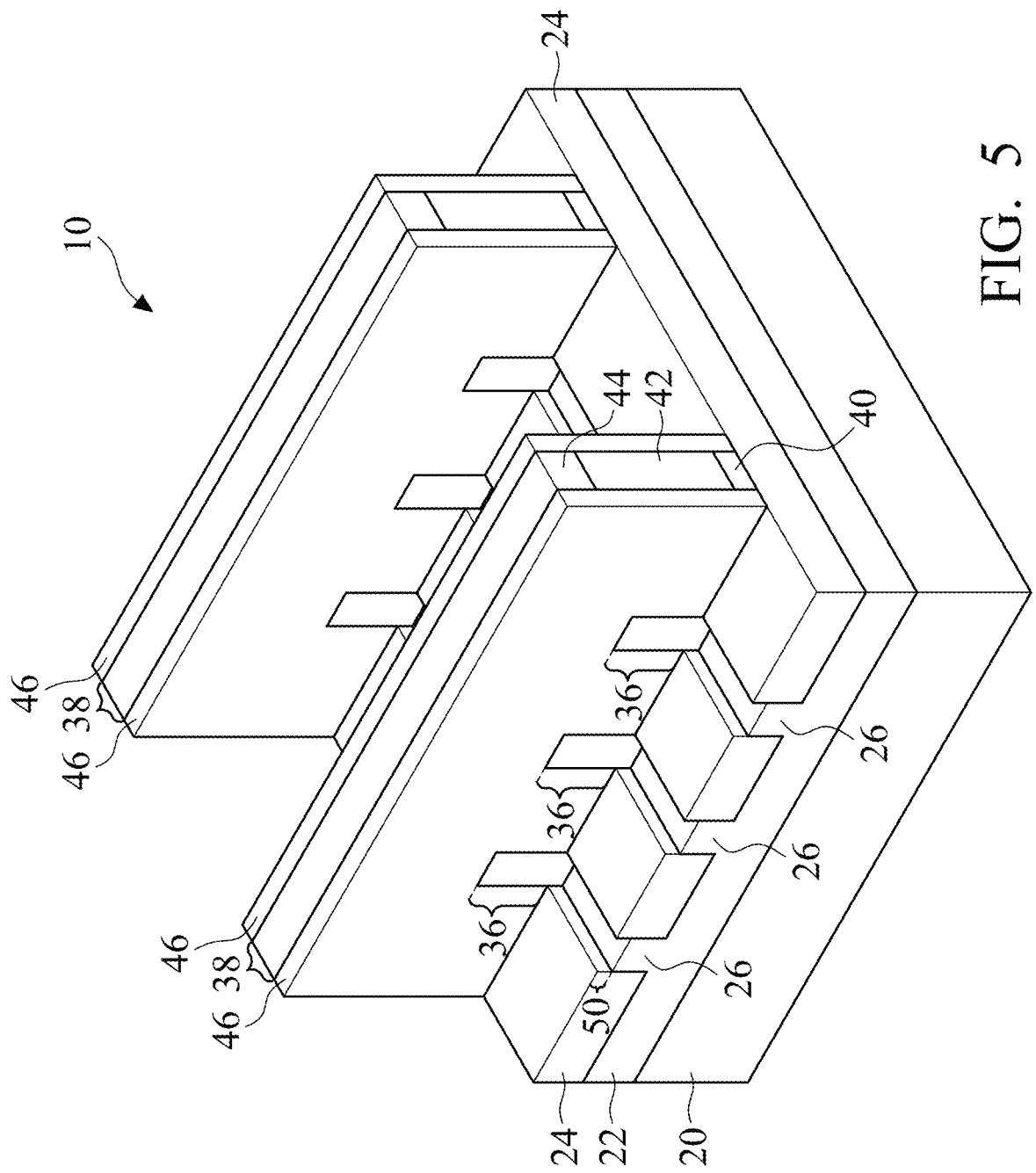

An etching process is then performed to etch the portions of protruding fins 36 that are not covered by dummy gate stacks 38 and gate spacers 46, resulting in the structure shown in FIG. 5. The respective process is illustrated as process 410 in the process flow 400 shown in FIG. 27. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24A of STI regions 24 in accordance with some embodiments. Recesses 50 are accordingly formed. Recesses 50 comprise portions located on the opposite sides of dummy gate stacks 38, and portions between remaining portions of protruding fins 36.

Figure 6:
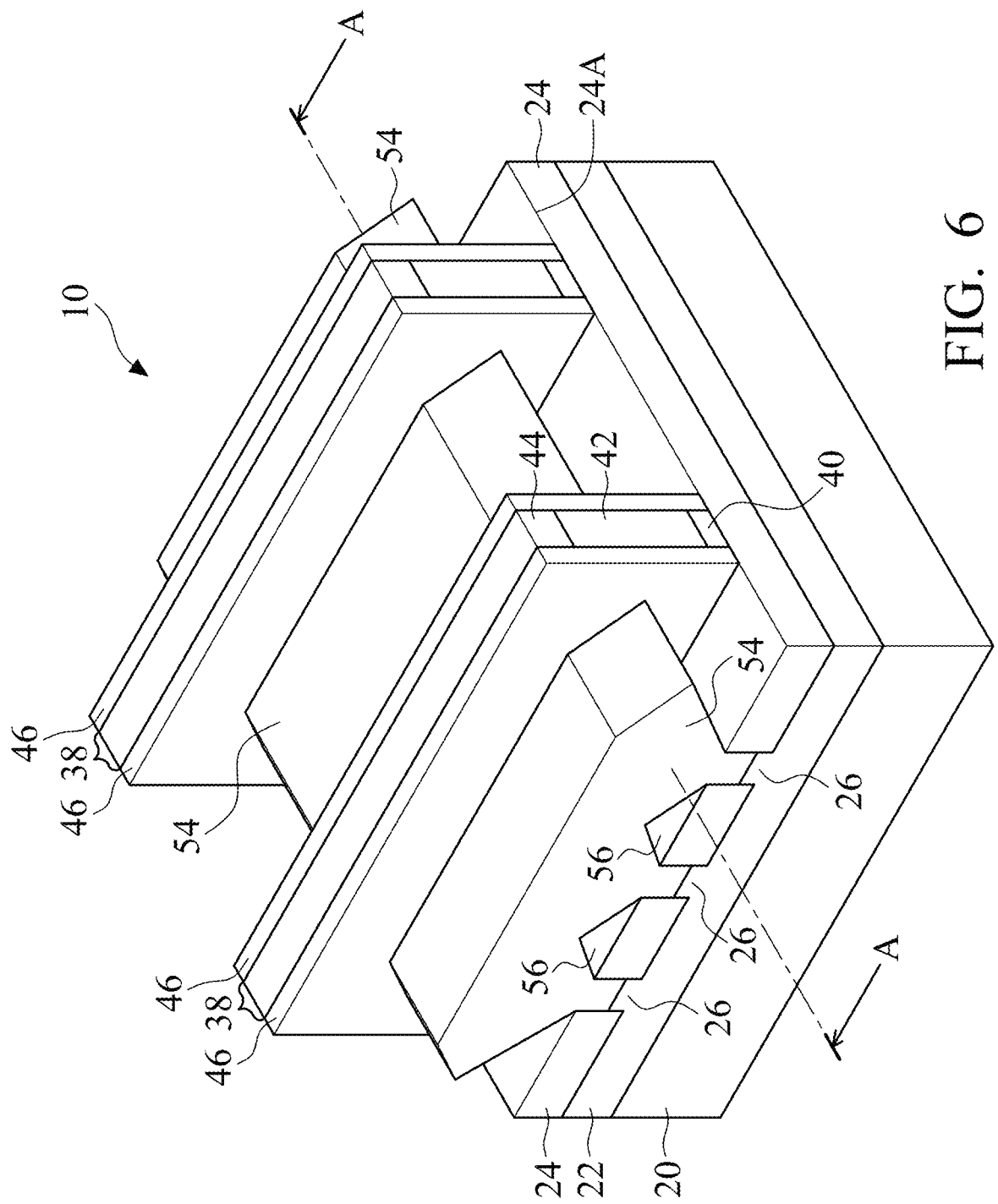

Next, epitaxy regions (source/drain regions) 54 are formed by selectively growing (through epitaxy) a semiconductor material in recesses 50, resulting in the structure in FIG. 6. The respective process is illustrated as process 412 in the process flow 400 shown in FIG. 26. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, or multi-layers thereof. After Recesses 50 are filled with epitaxy regions 54, the further epitaxial growth of epitaxy regions 54 causes epitaxy regions 54 to expand horizontally, and facets may be formed. The further growth of epitaxy regions 54 may also cause neighboring epitaxy regions 54 to merge with each other. Voids (air gaps) 56 may be generated. In accordance with some embodiments of the present disclosure, the formation of epitaxy regions 54 may be finished when the top surface of epitaxy regions 54 is still wavy, or when the top surface of the merged epitaxy regions 54 has become planar, which is achieved by further growing on the epitaxy regions 54 as shown in FIG. 6.

After the epitaxy step, epitaxy regions 54 may be further implanted with a p-type or an n-type impurity to form source and drain regions, which are also denoted using reference numeral 54. In accordance with alternative embodiments of the present disclosure, the implantation step is skipped when epitaxy regions 54 are in-situ doped with the p-type or n-type impurity during the epitaxy.

Figure 7A:
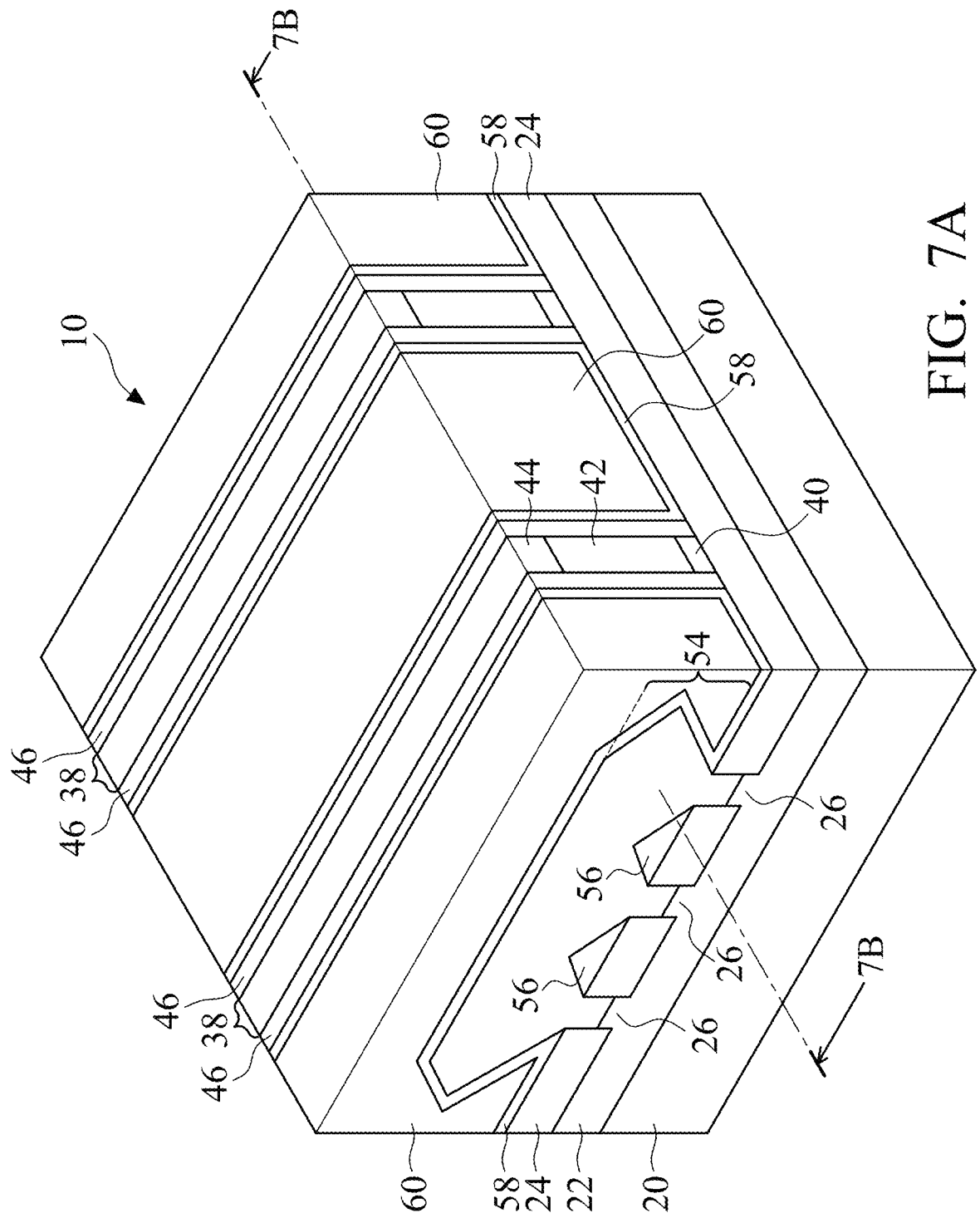

FIG. 7A illustrates a perspective view of the structure after the formation of Contact Etch Stop Layer (CESL) 58 and Inter-Layer Dielectric (ILD) 60. The respective process is illustrated as process 414 in the process flow 400 shown in FIG. 27. CESL 58 may be formed of silicon oxide, silicon nitride, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material such as Tetra Ethyl Ortho Silicate (TEOS) oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 38, and gate spacers 46 with each other.

Figure 7B:
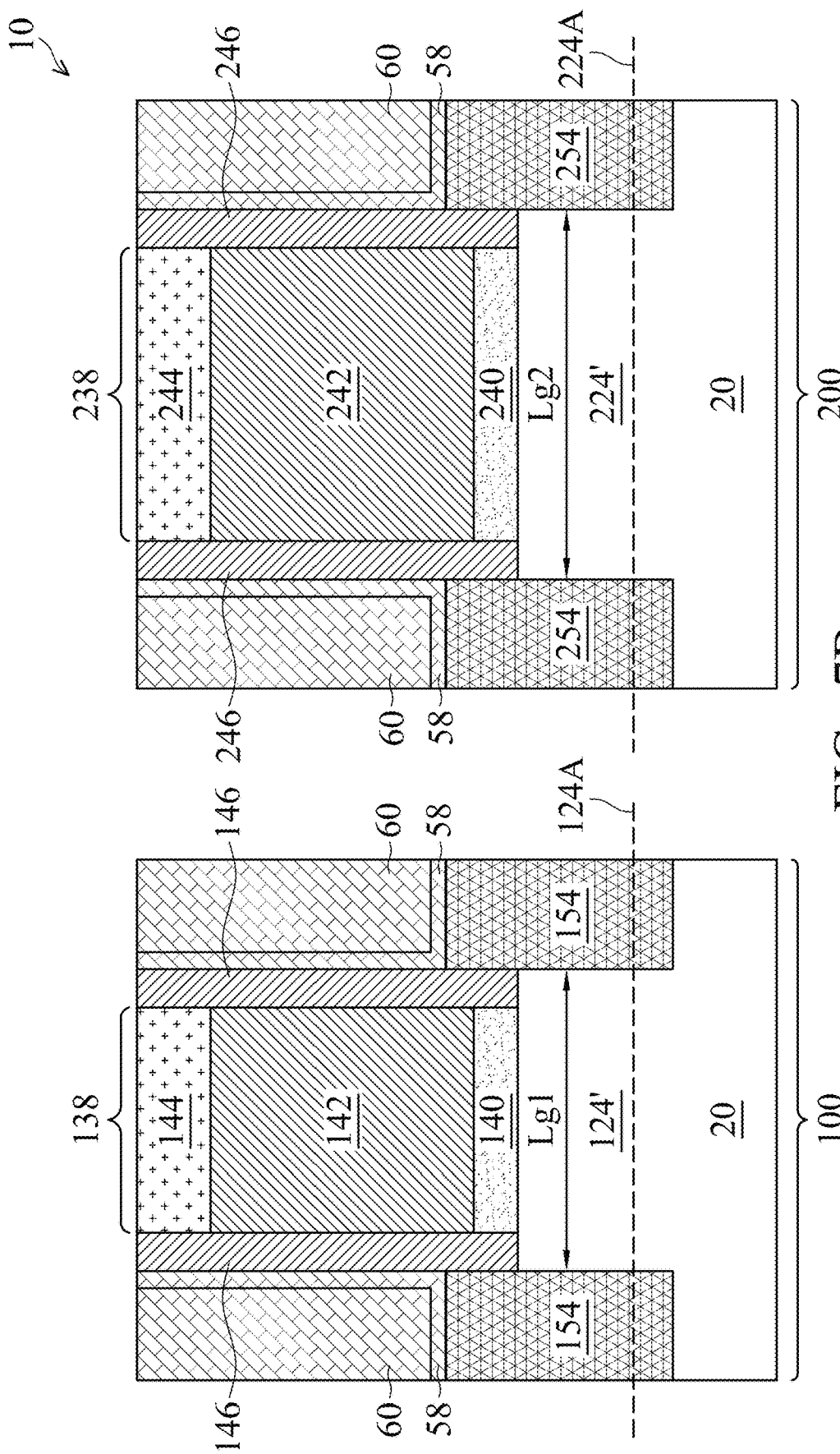

FIG. 7B illustrates the cross-sectional views of an intermediate structure in the formation of a shorter-channel FinFET and a longer-channel FinFET on same substrate 20. The shorter-channel device (which may be a FinFET) is formed in device region 100, and the longer-channel device (which may be a FinFET) is formed in device region 200. The shorter-channel device has a channel length Lg1 smaller than the channel length Lg2 of the longer-channel device, as illustrated. The ratio Lg2/Lg1 may be greater than about 1.5 or 2.0 in accordance with some embodiments, and may be in the range between about 1.5 and about 10. In accordance with some embodiments, the shorter-channel device is a core transistor or a transistor in other circuits such as Static Random Access Memories (SRAM), and the longer-channel device is a transistor in a driver circuit, a peripheral circuit, or the like. The cross-sectional view of either one of the shorter-channel device and the longer-channel device may correspond to the cross-sectional view obtained from the vertical plane containing line A-A in FIG. 6.

In accordance with some embodiments, each of the shorter-channel device and the longer-channel device may be a short-channel device, a mid-channel device, and a long-channel device. It is appreciated that the whether a device is a short-channel device, a mid-channel device, and a long-channel device is relative, and may be related to the formation technology of the devices (transistors). In accordance with some embodiments of the present disclosure, the channel lengths of the short-channel devices may be smaller than about 30 nm, and the channel lengths of the long-channel devices may be greater than about 100 nm. The channel lengths of the mid-channel devices may be in the range between about 30 nm and about 100 nm. When a transistor is a short-channel transistor, mid-channel transistor, or a long-channel transistor, the respective device region is accordingly referred to as a short-channel device region, a mid-channel device region, or a long-channel device region. It is appreciated that the channel-length ranges of the short-channel devices, mid-channel devices, and long-channel devices are examples, and may be redefined. For example, when the dimensions of the transistors are scaled down, the channel-length ranges of the short-channel transistors, mid-channel transistors, and long-channel transistors may be reduced. Each of device regions 100 and 200 may be any of the short-channel device region, mid-channel device region, and long-channel device region, providing the channel of the transistor in device region 200 is longer than the channel of the transistor in device region 100. For example, device region 100 may be a short-channel device region or a mid-channel device region, and device region 200 may be a mid-channel device region or a long-channel device region, respectively. Device regions 100 and 200 may both be short-channel device regions, both be mid-channel device regions, or both be long-channel device regions also.

To distinguish the features in the shorter-channel device from the features in the longer-channel device, the features in the shorter-channel device are represented using the reference numerals of the corresponding features in FIG. 7A plus number 100, and the features in the longer-channel device are represented using the reference numerals of the corresponding features in FIG. 7A plus number 200. For example, the source/drain regions 154 and 254 in FIG. 7B correspond to source/drain region 54 in FIG. 7A. The gate spacers in the shorter-channel device region and the longer-channel device region are denoted as 146 and 246, respectively. The corresponding features in the shorter-channel device and the longer-channel device may be formed in common processes, with some of the example processes discussed in subsequent paragraphs.

After the structure shown in FIGS. 7A and 7B is formed, the dummy gate stacks 138 and 238 are replaced with metal gates and replacement gate dielectrics, as shown in FIGS. 8A, 8B and 9 through 14. In FIGS. 8A, 8B and 9 through 14, the top surfaces 124A and 224A of STI regions 24 are illustrated, and semiconductor fins 124' and 224' protrude higher than top surfaces 124A and 224A, respectively.

Figure 8A:
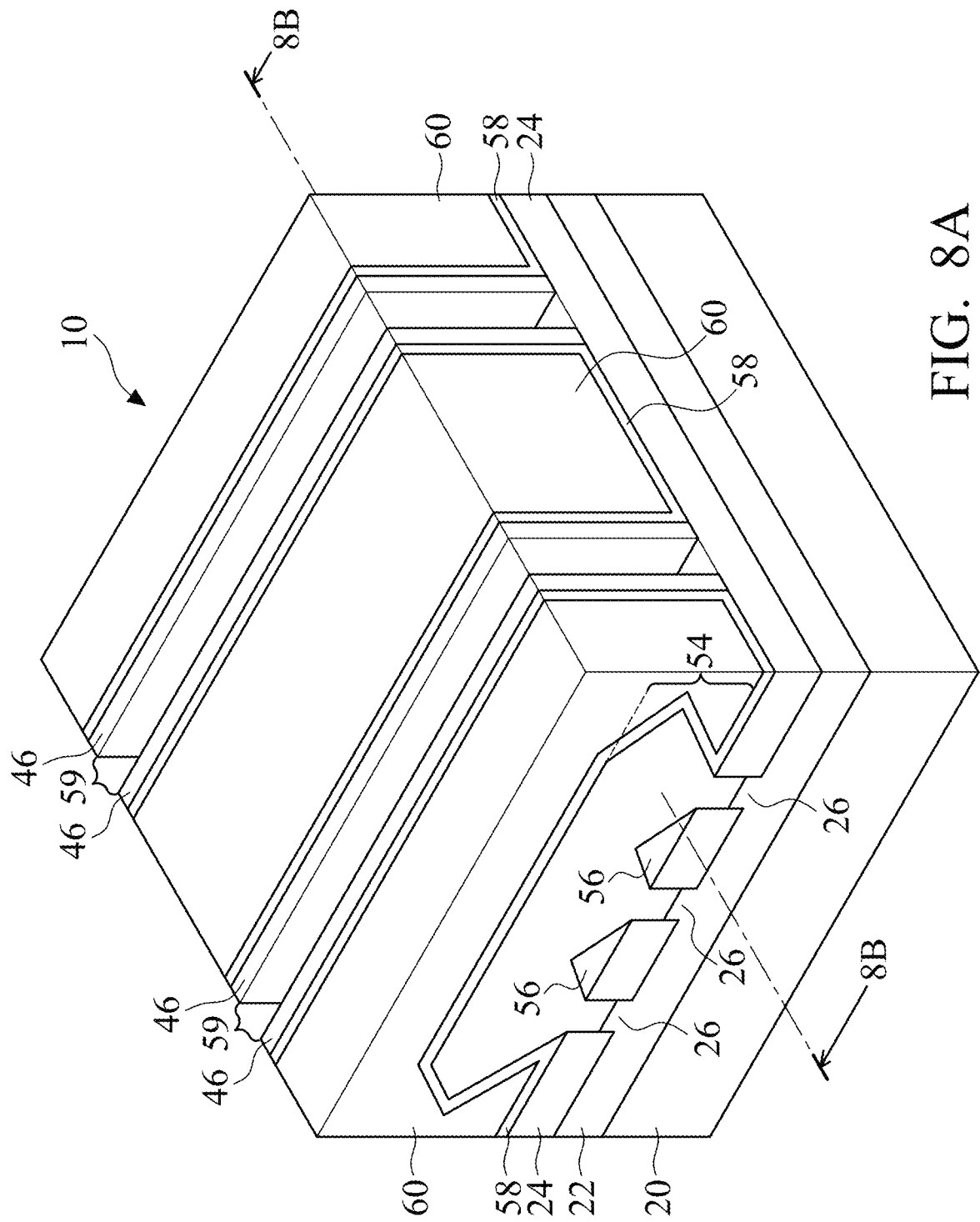
Figure 8B:
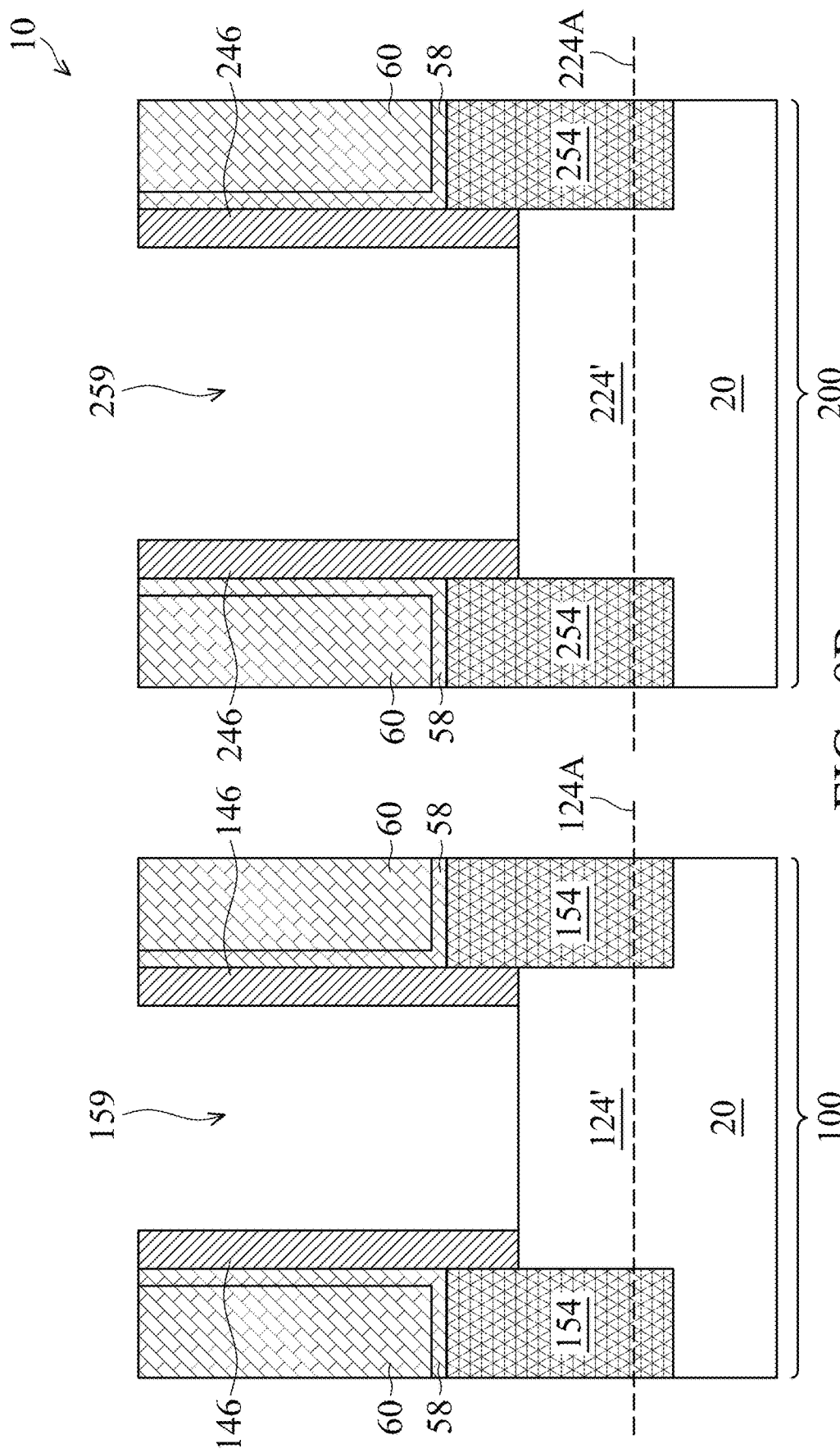

To form the replacement gates, hard mask layers 144 and 244, dummy gate electrodes 142 and 242, and dummy gate dielectrics 140 and 240 as shown in FIGS. 7A and 7B are removed first, forming openings 59 as shown in FIG. 8A. The respective process is illustrated as process 416 in the process flow 400 shown in FIG. 27. Openings 59 in FIG. 8A correspond to opening 159 in device region 100 and opening 259 in device region 200 as in FIG. 8B. The top surfaces and the sidewalls of protruding fins 124' and 224' are exposed to openings 159 and 259, respectively.

Figure 9:
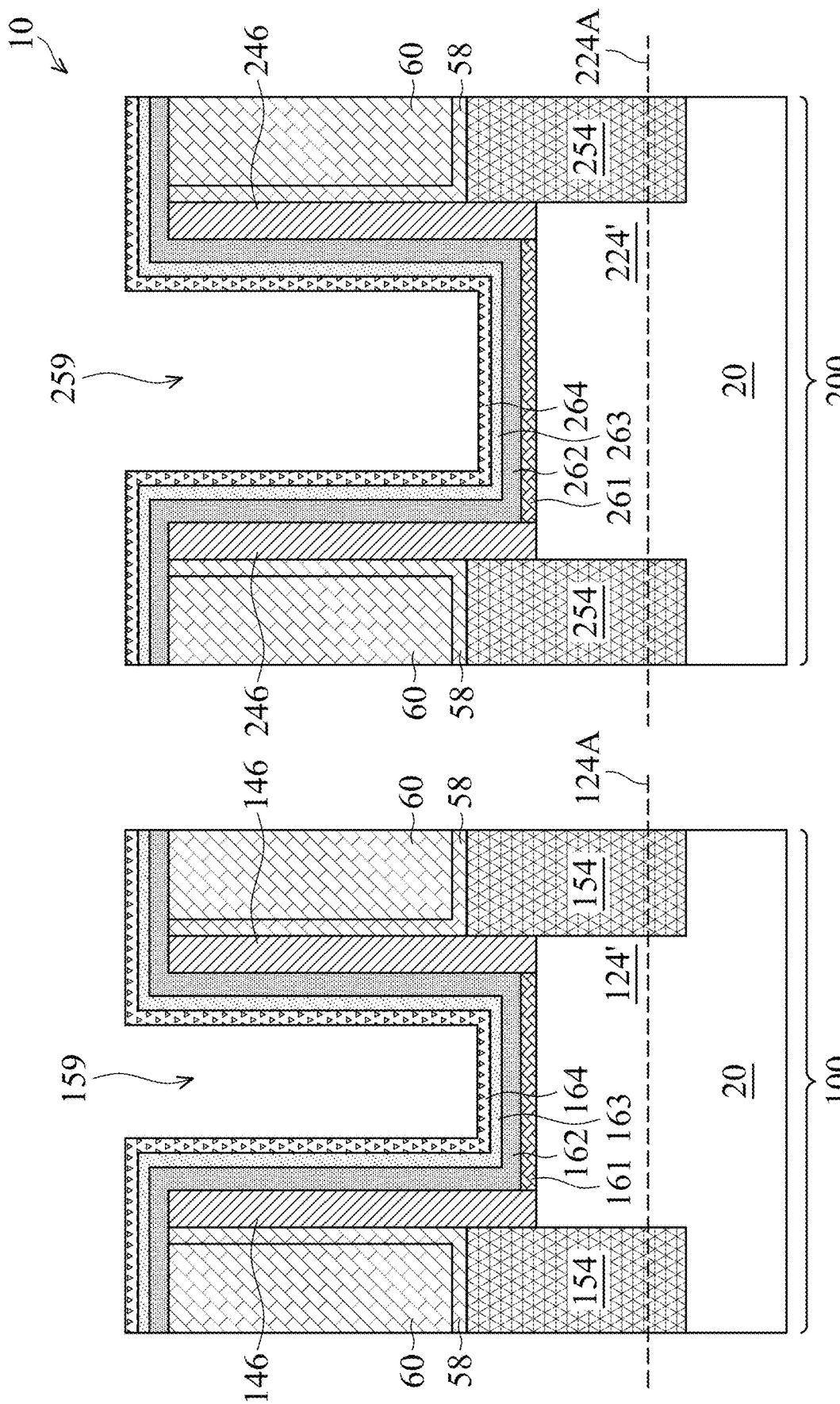

Next, referring to FIG. 9, gate dielectrics 161/162 and 261/262 are formed, which extend into openings 159 and 259, respectively. The respective process is illustrated as process 418 in the process flow 400 shown in FIG. 26. In accordance with some embodiments of the present disclosure, the gate dielectrics include Interfacial Layers (ILs) 161 and 261, which are formed on the exposed surfaces of protruding fins 124' and 224', respectively. ILs 161 and 261 may include an oxide layer such as a silicon oxide layer, which is formed through the thermal oxidation of protruding fins 124' and 224', a chemical oxidation process, or a deposition process. The gate dielectrics may also include high-k dielectric layers 162 and 262 over the corresponding ILs 161 and 261. High-k dielectric layers 162 and 262 may be formed of a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0, and sometimes as high as 21.0 or higher. High-k dielectric layers 162 and 262 are overlying, and may contact, the respective underlying ILs 161 and 261. High-k dielectric layers 162 and 262 are formed as conformal layers, and extend on the sidewalls of protruding fins 124' and 224' and the top surface and the sidewalls of gate spacers 146 and 246, respectively. In accordance with some embodiments of the present disclosure, high-k dielectric layers 162 and 262 are formed using ALD or CVD. High-k dielectric layers 162 and 262 may be portions of the same dielectric layer, and are formed simultaneously with the same material and the same thickness, or separately with different materials and/or different thicknesses.

Further referring to FIG. 9, work-function layers 163 and 263 are formed through deposition. The respective process is illustrated as process 420 in the process flow 400 shown in FIG. 26. Each of work-function layers 163 and 263 includes at least one homogenous layer having an entirety formed of a same material, or may include a plurality of sub layers formed of different materials. The corresponding layers in work-function layers 163 and 263 are formed in common deposition processes. The specific material of the layers in work-function layers 163 and 263 may include work-function metals selected according to whether the respective FinFETs formed in device regions 100 and 200 are n-type FinFETs or p-type FinFETs. For example, when the FinFETs are n-type FinFETs, work-function layers 163 and 263 may include a titanium nitride (TiN) layer, a tantalum nitride (TaN) layer, and an Al-based layer (formed of, for example, TiAl, TiAlN, TiAlC, TaAlN, or TaAlC). When the FinFETs are p-type FinFET, work-function layers 163 and 263 may include a TiN layer, a TaN layer, and another TiN layer.

In accordance with some embodiments of the present disclosure, capping layers 164 and 264 (which are also adhesion layers) are formed over work-function layers 163 and 263, respectively. The respective process is illustrated as process 422 in the process flow 400 shown in FIG. 26. Capping layers 164 and 264 may be metal-containing layers, which may be formed of TiN in accordance with some embodiments. Other materials such as TaN may be used. In accordance with some embodiments, capping layers 164 and 264 are formed using ALD. The thickness of capping layers 164 and 264 are small enough so that they don't significantly block the diffusion of fluorine in overlying layers into the underlying work-function layers 163 and 263. Rather, the function for blocking fluorine is achieved by the subsequently formed fluorine-blocking layer. In accordance with some embodiments of the present disclosure, capping layers 164 and 264 have thicknesses smaller than about 40 Å, and the thicknesses may be in the range between about 10 nm and about 40 nm. Capping layers 164 and 264 may be portions of the same metal-containing layer, which are formed simultaneously with the same material and the same thickness, or separately with different materials and/or different thicknesses.

Figure 10:
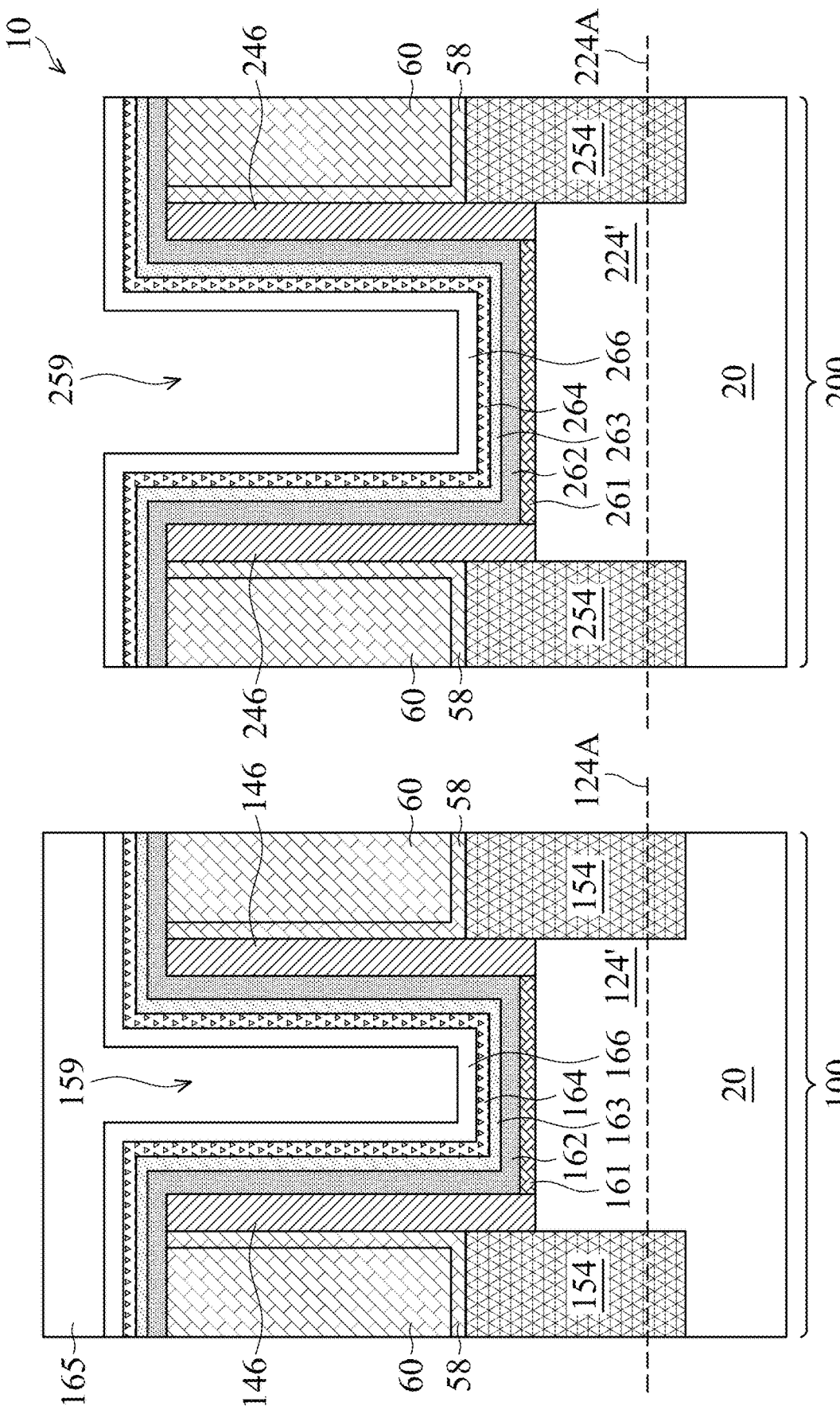

FIG. 10 illustrates the formation of fluorine-blocking layers 166 and 266 in device regions 100 and 200, respectively. The respective process is illustrated as process 424 in the process flow 400 shown in FIG. 27. Fluorine-blocking layers 166 and 266 are formed of materials (such as metals) that have good ability for blocking fluorine from diffusing through them, and/or have ability to trap fluorine therein. Also, fluorine-blocking layers 166 and 266 have low resistivity values. Fluorine-blocking layers 166 and 266 may be formed of a material that has a high density, for example, with a density higher than about 8 g/cm$^3$. The resistivity may be lower than about 600 μm*cm. Fluorine-blocking layers 166 and 266 may be formed of metals such as tungsten, cobalt, molybdenum, or alloys thereof. The thickness of fluorine-blocking layers 166 and 266 may be great enough to block at least a majority (such as more than 75 percent, or more than 90 percent) of the fluorine diffused from the overlying layers from reaching work-function layers 163 and 263 (if fluorine-blocking layer 266 is not removed in subsequent processes). The desirable thickness is also related to the material, and the fluorine-blocking layers formed of denser materials may be formed thinner without sacrificing their ability for suppressing diffusion. Fluorine-blocking layers 166 and 266 may also include other high-density materials such as silicon nitride, silicon oxide, aluminum-based oxide, or the like. The dielectric fluorine-blocking layer may be overlying or underlying the metallic fluorine-blocking layer. These materials, although being dielectric materials, may have a thickness great enough to at least partially block fluorine diffusion, yet small enough for electrical tunneling. For example, the thickness of the dielectric material may be smaller than about 20 Å, and may be in the range between about 5 Å and about 20 Å.

In accordance with some embodiments of the present disclosure in which metals such as tungsten, cobalt, or molybdenum are used, the thickness of fluorine-blocking layers 166 and 266 is greater than about 15 Å in order to sufficiently suppress the diffusion. The thickness may be in the range between about 15 Å and about 30 Å.

The formation method of fluorine-blocking layers 166 and 266 may include ALD. The deposition process is performed using process gases that are free from fluorine, and the processes gases may include hydrogen ($H_2$) and a metal-containing process gas. For example, when fluorine-blocking layers 166 and 266 are formed of tungsten, the respective metal-containing process gas may include $WCl_x$, $WBr_x$, WCN, or combinations thereof. The process gas may or may not include $NH_3$. The deposition may be performed at a temperature in the range between about 200° C. and about 450° C. The resulting fluorine-blocking layers 166 and 266 may have a crystalline structure. The respective fluorine-blocking layers 166 and 266 are free from fluorine at the time of deposition. Fluorine-blocking layers 166 and 266 may be portions of the same metal-containing layer, and are formed simultaneously with the same material and the same thickness, or may be formed separately with different materials and/or different thicknesses.

Figure 11:
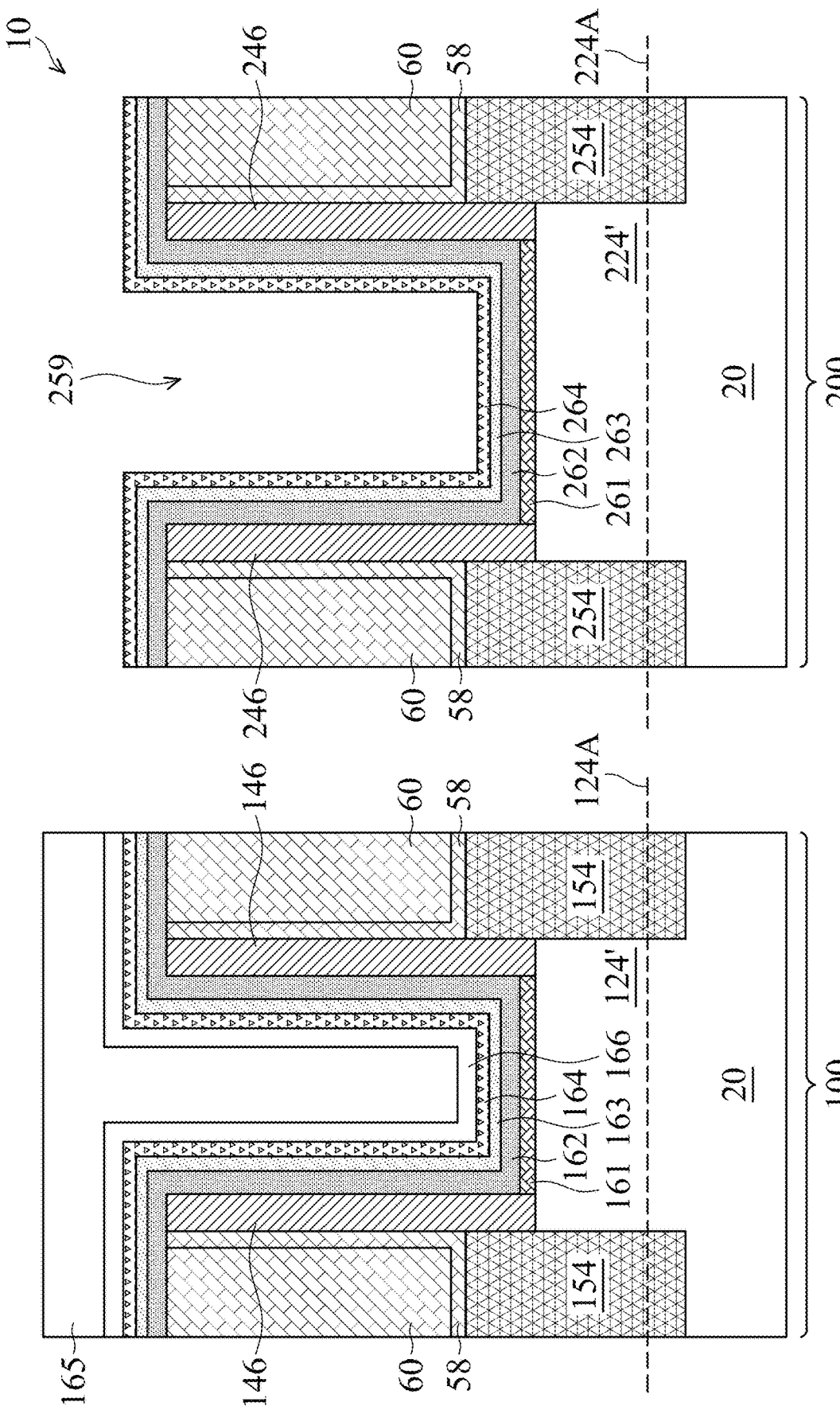

Further referring to FIG. 10, etching mask 165 is formed, and is patterned to protect fluorine-blocking layer 166, while fluorine-blocking layer 266 (FIG. 10) is exposed. Etching mask 165 may be formed of photo resist. Next, fluorine-blocking layer 266 is removed in an etching process, exposing the underlying capping layer 264, as shown in FIG. 11. The respective process is illustrated as process 426 in the process flow 400 shown in FIG. 27. Etching mask 165 is then removed, for example, in an ashing process.

Figure 12:
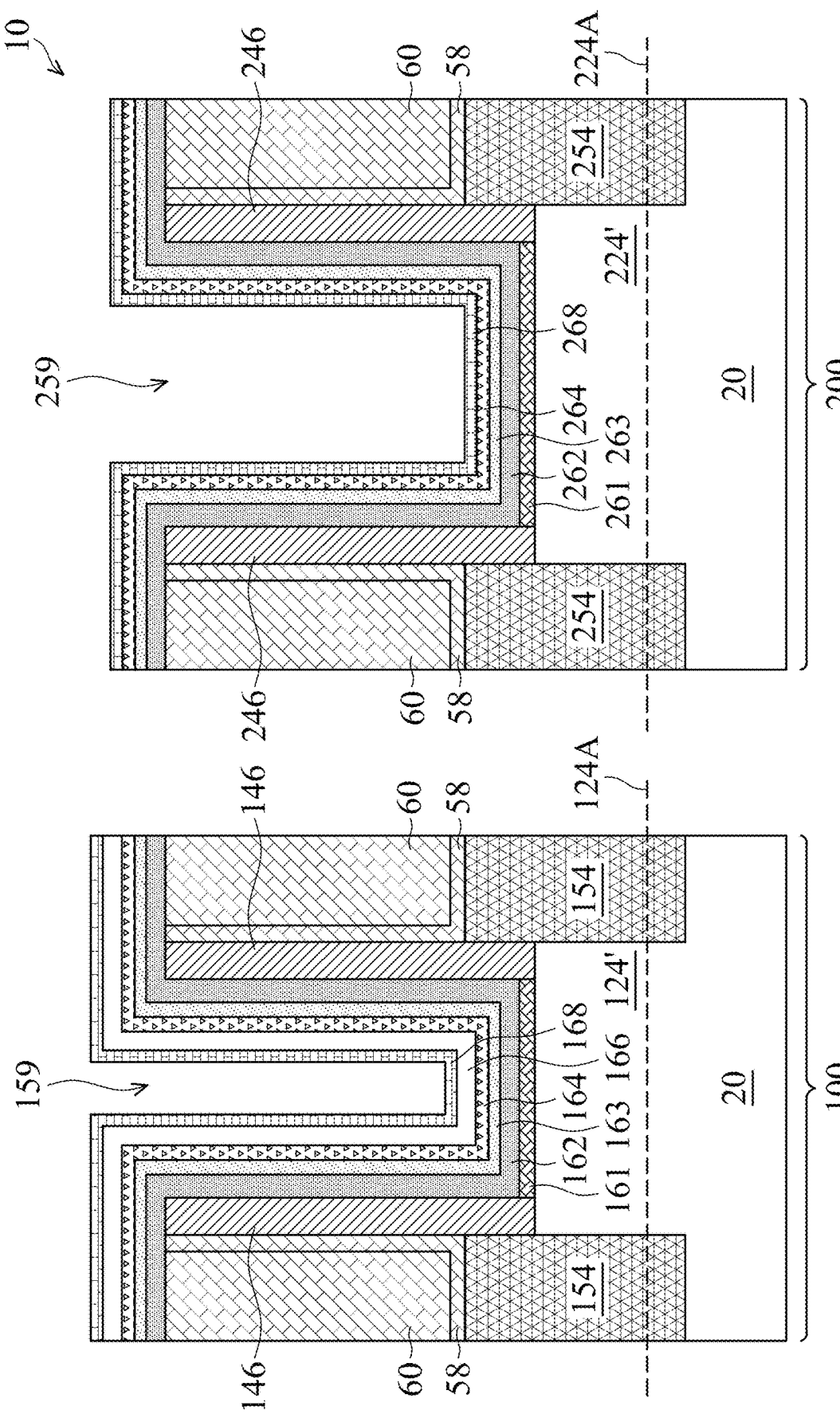

FIG. 12 illustrates the formation of nucleation layers 168 and 268, which are used for the nucleation to help the formation of the subsequent deposited fluorine-containing metal layers 170 and 270. The respective process is illustrated as process 428 in the process flow 400 shown in FIG. 27. In accordance with some embodiments, nucleation layers 168 and 268 are formed using ALD by pulsing a first gas such as $H_2$, $B_2H_6$, $NH_3$, or the like and a second gas, which may be a metal halide such as $WF_6$. Other methods such as CVD may be used, and the process gas may include $WF_6$ and $H_2$ and some carrier gases such as argon. Accordingly, nucleation layers 168 and 268 may include fluorine therein. The deposition may be performed at a temperature in the range between about 250° C. and about 450° C. Nucleation layers 168 and 268 may have a thickness in the range between about 10 Å and about 50 Å, while a greater thickness may be adopted. In device region 100, nucleation layer 168 is over, and may be in contact with, fluorine-blocking layer 166. In device region 200, nucleation layer 268 is over, and may be in contact with, capping layer 264. Due to the addition of some impurities in nucleation layers 168 and 268, nucleation layers 168 and 268 may be amorphous.

Figure 13:
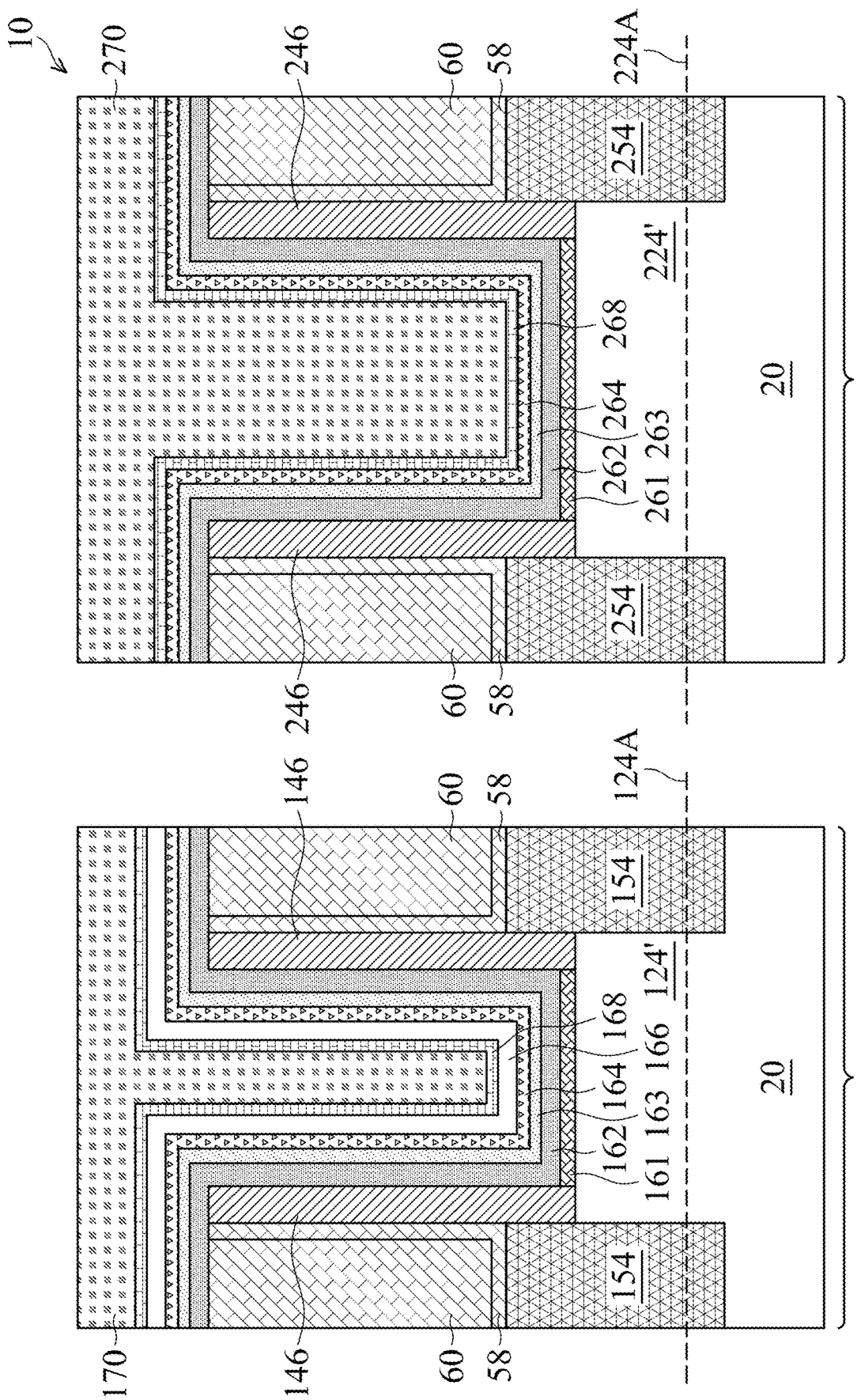

FIG. 13 illustrates a gap-filling process, in which fluorine-containing metal layers 170 and 270 are formed to fill the remaining openings 159 and 259 (FIG. 12). The respective process is illustrated as process 430 in the process flow 400 shown in FIG. 27. In accordance with some embodiments, fluorine-containing metal layers 170 and 270 are formed using CVD. Alternatively, ALD may be used, although ALD has a lower deposition rate than CVD. The process gas may include $WF_6$, $H_2$ and some carrier gases such as argon. Accordingly, fluorine-containing metal layers 170 and 270 also include fluorine therein. The deposition may be performed at a temperature in the range between about 250° C. and about 450° C. In accordance with some embodiments of the present disclosure, fluorine-blocking layers 166, nucleation layer 168, and fluorine-containing metal layer 170 are distinguishable from each other, for example, using Transmission Electron Microscopy (TEM), regardless of whether they include the same metal or not. Nucleation layer 268 and fluorine-containing metal layer 270 may also be distinguished from each other using TEM.

Figure 14:
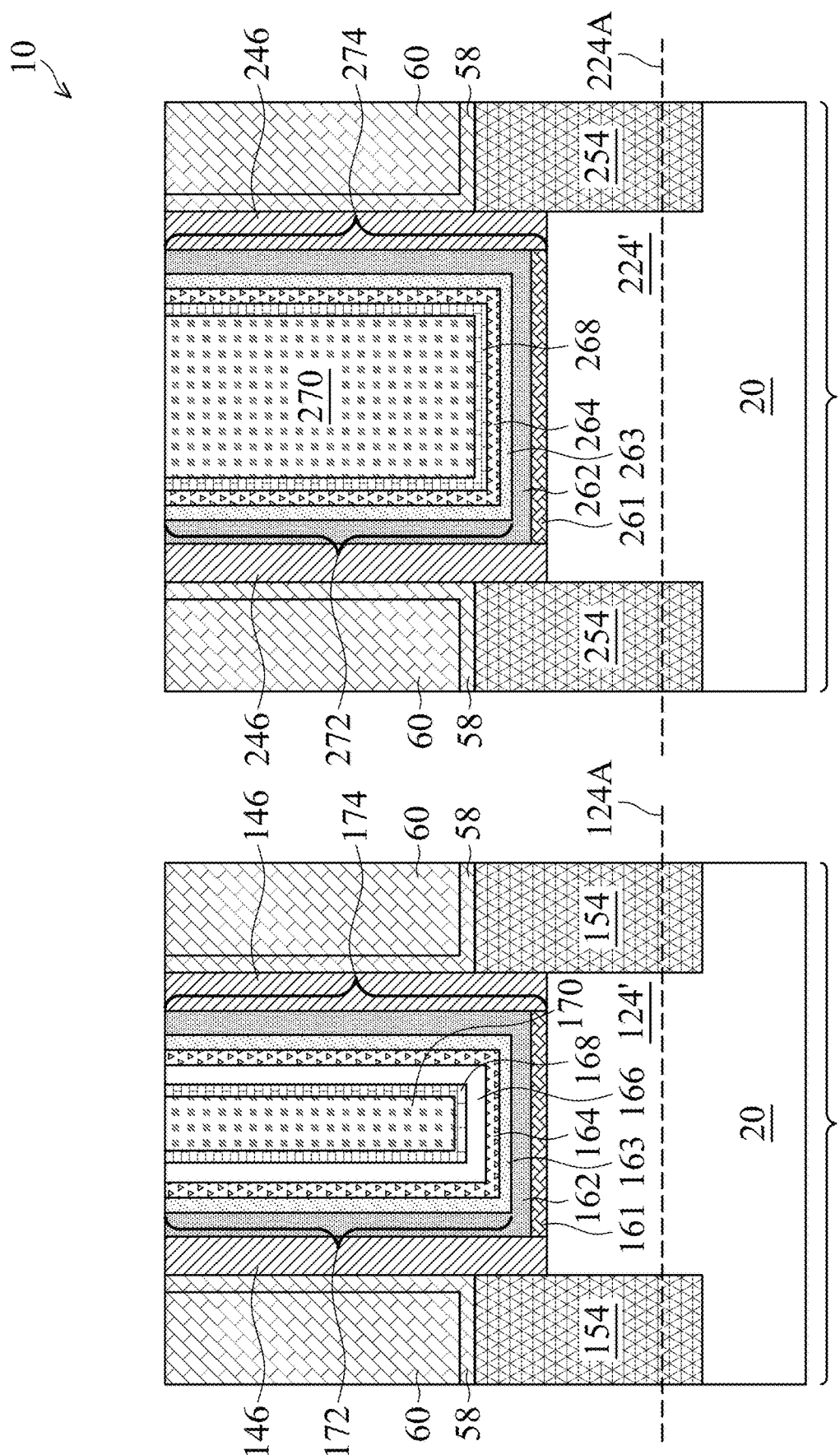

After the formation of fluorine-containing metal layers 170 and 270, a planarization process such a Chemical Mechanical Polish (CMP) process or a mechanical polish process may be performed to remove excess portions of the deposited layers as shown in FIG. 13, resulting in the gate stacks 174 and 274 as shown in FIG. 14. The respective process is illustrated as process 432 in the process flow 400 shown in FIG. 27. Gate stacks 174 and 274 include gate dielectrics 161/162 and 261/262, respectively, and gate electrodes 172 and 272, respectively.

Figure 15:
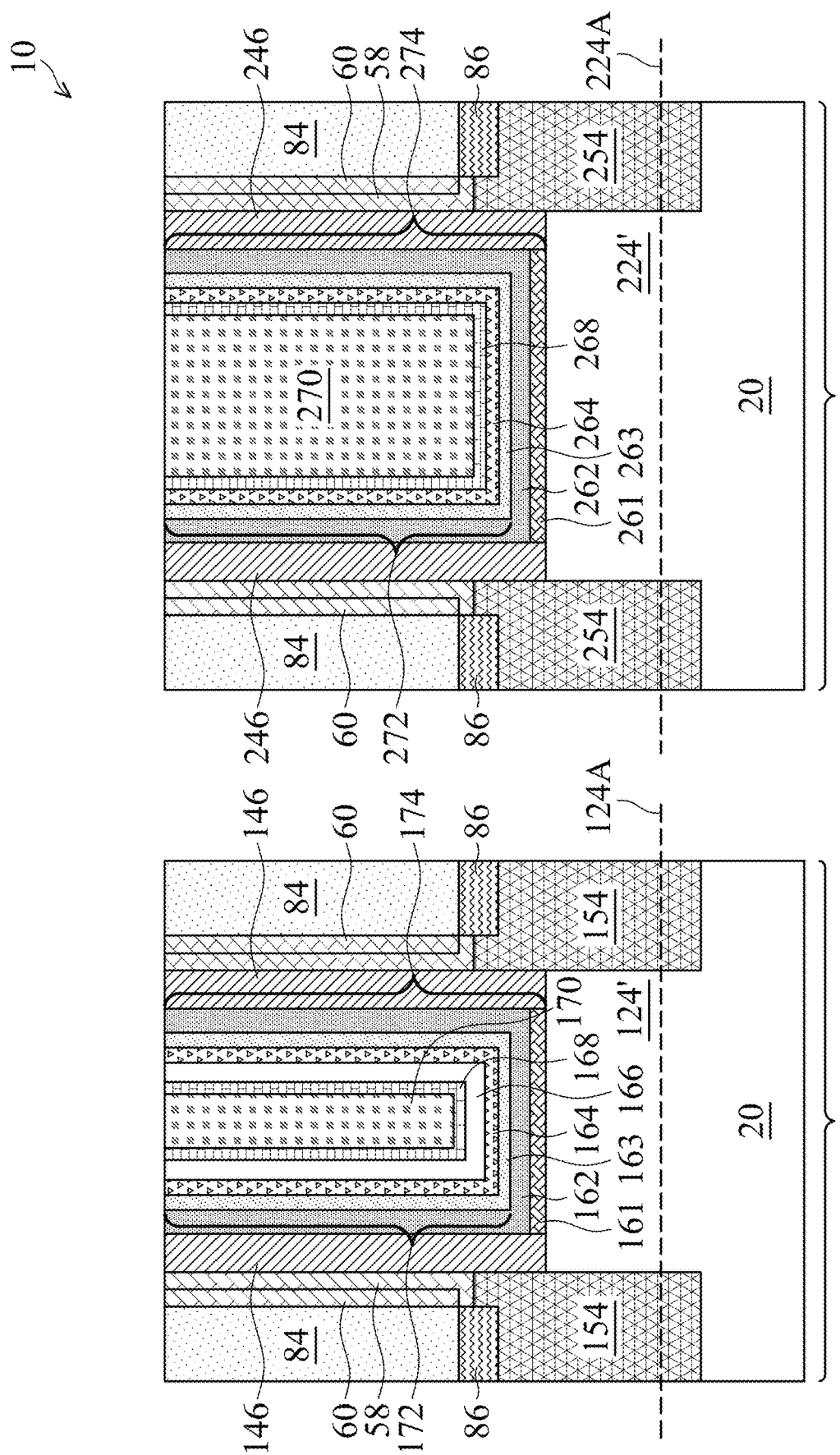

FIG. 15 illustrates the formation of source/drain contact plugs 84 and source/drain silicide regions 86. The formation of source/drain contact plugs 84 include s forming contact openings by etching ILD 60 to expose the underlying portions of CESL 58, and then etching the exposed portions of CESL 58 to reveal source/drain regions 154 and 254. In a subsequent process, a metal layer (such as a Ti layer) is deposited and extending into the contact openings. A metal nitride capping layer may be formed. An anneal process is then performed to react the metal layer with the top portion of source/drain regions 154/254 to form silicide regions 86. Next, either the previously formed metal nitride layer is left without being removed, or the previously formed metal nitride layer is removed, followed by the deposition of a new metal nitride layer (such as a titanium nitride layer). A filling-metallic material such as tungsten, cobalt, or the like, is then filled into the contact openings, followed by a planarization to remove excess materials, resulting in source/drain contact plugs 84.

Figure 16A:
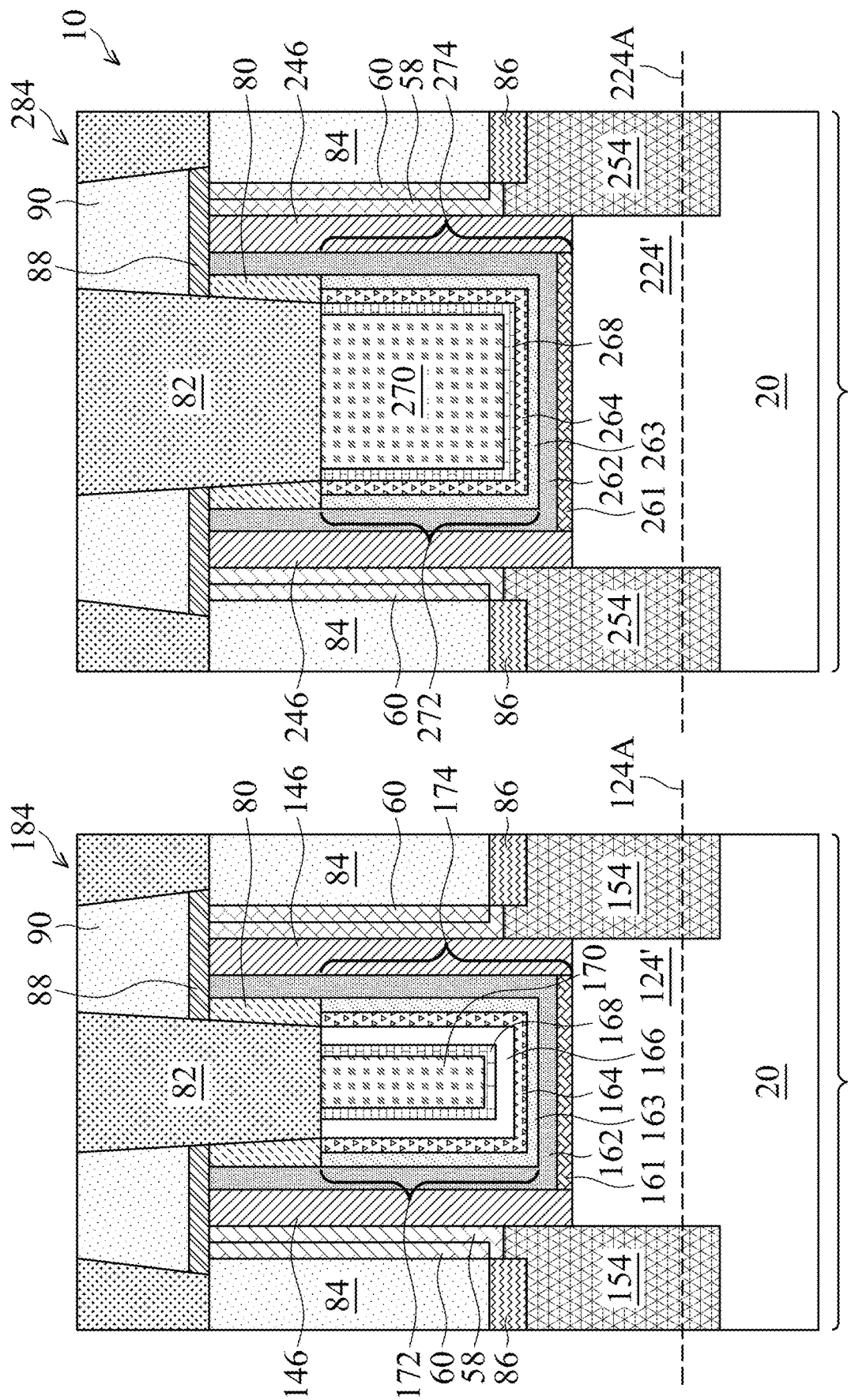

FIG. 16A illustrates the formation of hard masks 80 in accordance with some embodiments. The formation of hard masks 80 may include performing an etching process to recess gate stacks 174 and 274, so that recesses are formed between the opposite portions of gate spacers 146 and 246, filling the recesses with a dielectric material, and then performing a planarization process such as a CMP process or a mechanical grinding process to remove excess portions of the dielectric material. Hard masks 80 may be formed of silicon nitride, silicon oxynitride, silicon oxy-carbo-nitride, or the like. Etch stop layers 88 and dielectric layers 90 are then formed. Gate contact plugs 82 are formed to penetrate through a portion of each of hard masks 80 to contact gate electrodes 172 and 272. Shorter-channel FinFET 184 and longer-channel FinFET 284 are thus formed.

Figure 16B:
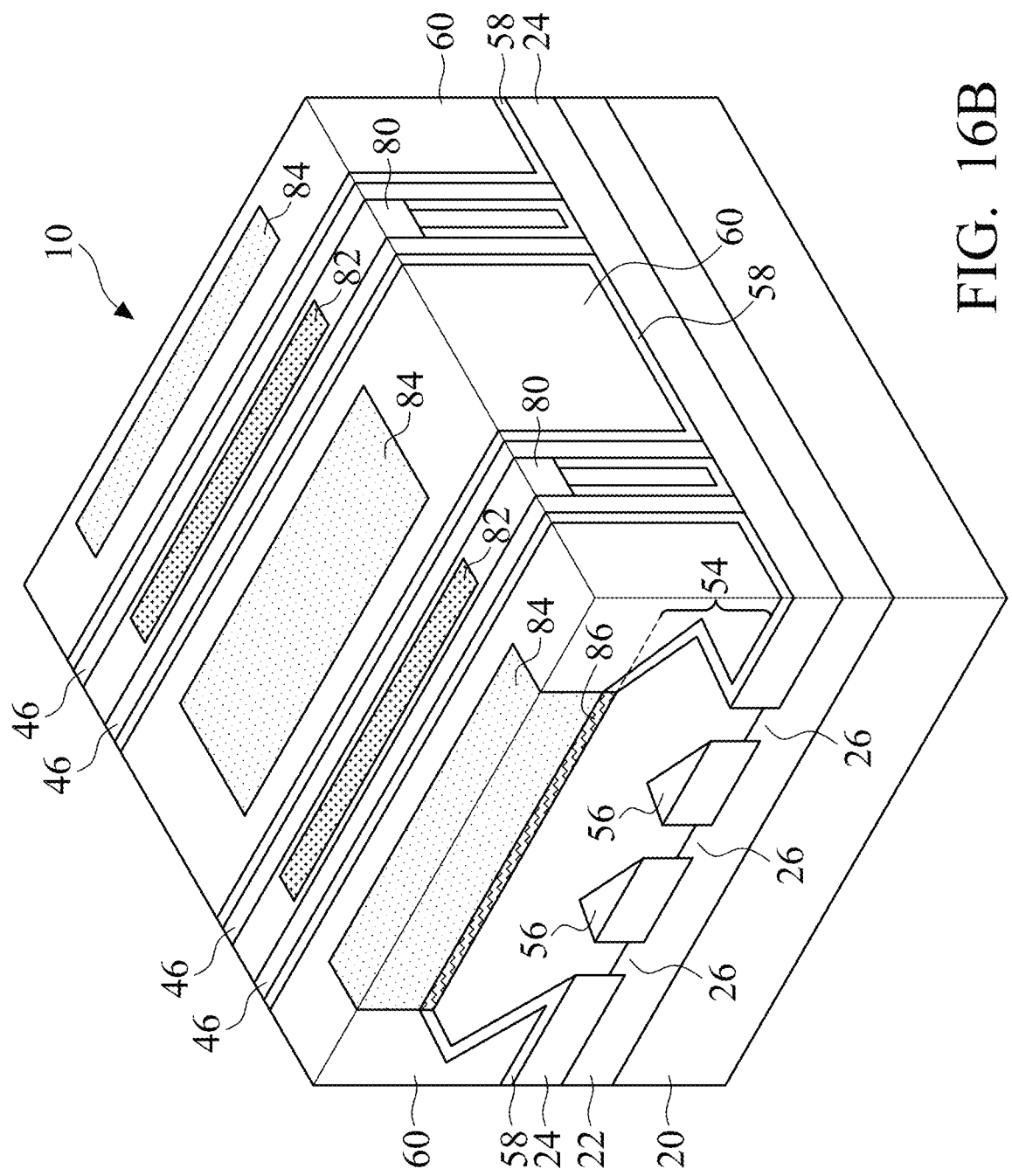
Figure 17:
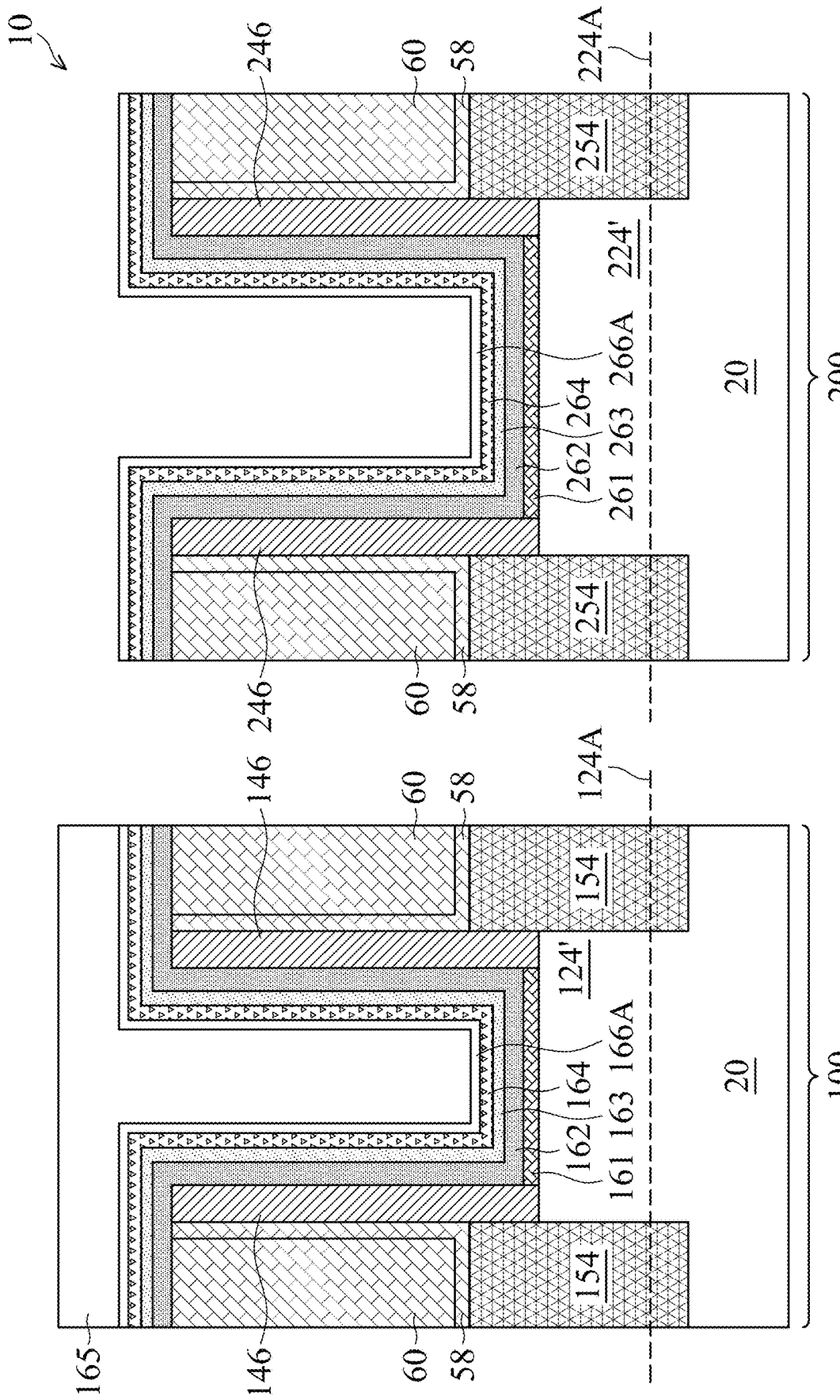
FIGS. 17 through 23 illustrate the perspective views and cross-sectional views of intermediate stages in the formation of Fin Field-Effect Transistors (FinFETs) in accordance with some embodiments.

FIG. 16B illustrates a perspective view of a FinFET, which may represent either one of shorter-channel FinFET 184 and longer-channel FinFET 284 as shown in FIG. 16A. Gate contact plug 82, source/drain silicide regions 86, and source/drain contact plugs 84 are also illustrated.

Figure 26:
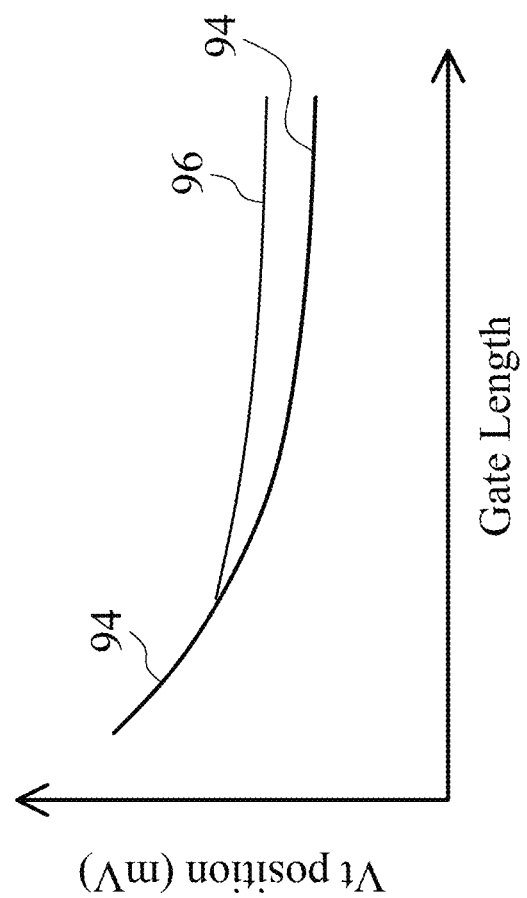
FIG. 26 illustrates a diagram of threshold voltages and channel lengths in accordance with some embodiments.

As shown in FIG. 16A, shorter-channel FinFET 184 includes fluorine-blocking layer 166, which prevents and/or reduces the fluorine in overlying layers 168 and 170 from diffusing into work-function layer 163. As a result, the increase in threshold voltage in the shorter-channel FinFET 184 is suppressed. On the other hand, in the longer-channel FinFET 284, there is no fluorine-blocking layer, and hence fluorine may diffuse into the underlying work-function layer 263 to cause the increase in the threshold voltage of the longer-channel FinFET 284. Due to geometry effect, as shown in FIG. 26, with the increase in the channel lengths, the threshold voltages of FinFETs reduce, as represented by line 94. If the fluorine-blocking layer is formed in the longer-channel FinFET also, the threshold voltage of the longer-channel FinFET may be too low for the longer-channel FinFET to operate normally. Accordingly, by forming the fluorine-blocking layer in the shorter-channel FinFET but not in the longer-channel FinFET, the high threshold voltage of the shorter-channel FinFET is suppressed, while the low threshold voltage of the longer-channel FinFET is not suppressed. Line 96 represents the increased threshold voltage due to the diffusion of fluorine into the longer-channel FinFETs.

FIGS. 17 through 23 illustrate cross-sectional views of intermediate stages in the formation of FinFETs in accordance with some embodiments of the present disclosure. Unless specified otherwise, the materials and the formation processes of the components in these embodiments are essentially the same as the like components, which are denoted by like reference numerals in the preceding embodiments shown in FIGS. 1-6, 7A, 7B, 8A, 8B, 9-15, 16A, and 16B. The details regarding the formation processes and the materials of the components shown in FIGS. 17 through 23 may thus be found in the discussion of the preceding embodiments.

The initial steps of these embodiments are essentially the same as shown in FIGS. 1 through 9. Next, referring to FIG. 17, fluorine-blocking layers 166A and 266A are formed through deposition. The materials and the formation methods of fluorine-blocking layers 166A and 266A may be selected from the candidate materials and the candidate formation methods as discussed in the preceding embodiments, and hence are not repeated herein. The thickness of fluorine-blocking layers 166A and 266A is smaller than fluorine-blocking layers 166 and 266 in FIG. 10. Furthermore, the thickness of fluorine-blocking layers 166A and 266A is small enough so that some fluorine (for example, between about 40 percent and about 70 percent) may penetrate through to cause noticeable increase in the threshold voltage of the respective FinFETs. The thickness will be discussed in detail in subsequent paragraphs.

Figure 18:
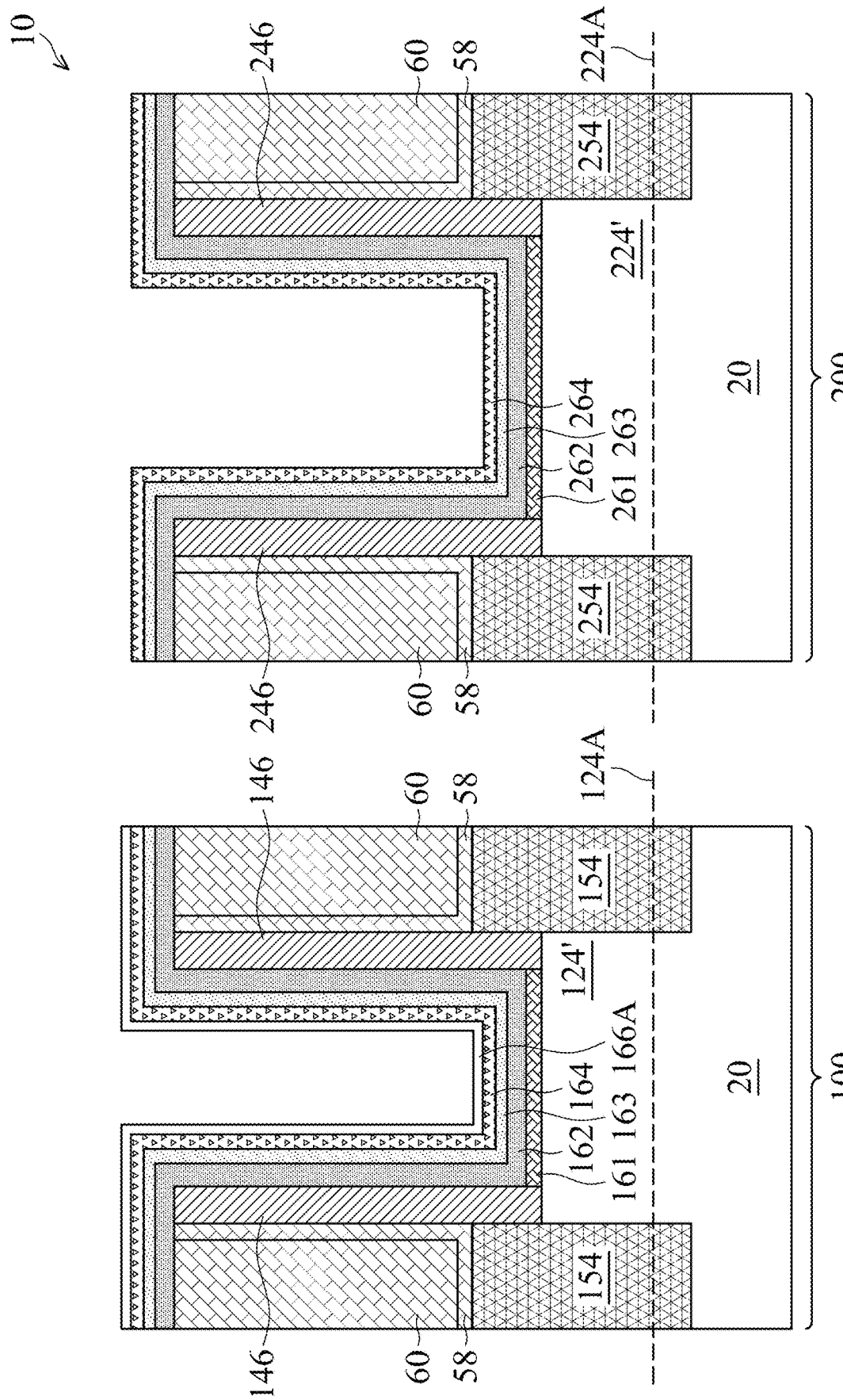

Etching mask 165 is then formed, and is patterned, so that the remaining portions protect fluorine-blocking layer 166A in device region 100, while fluorine-blocking layer 266A is exposed. Next, fluorine-blocking layer 266A is removed in an etching process, exposing the underlying capping layer 264. Etching mask 165 is then removed, and the resulting structure is shown in FIG. 18.

Figure 19:
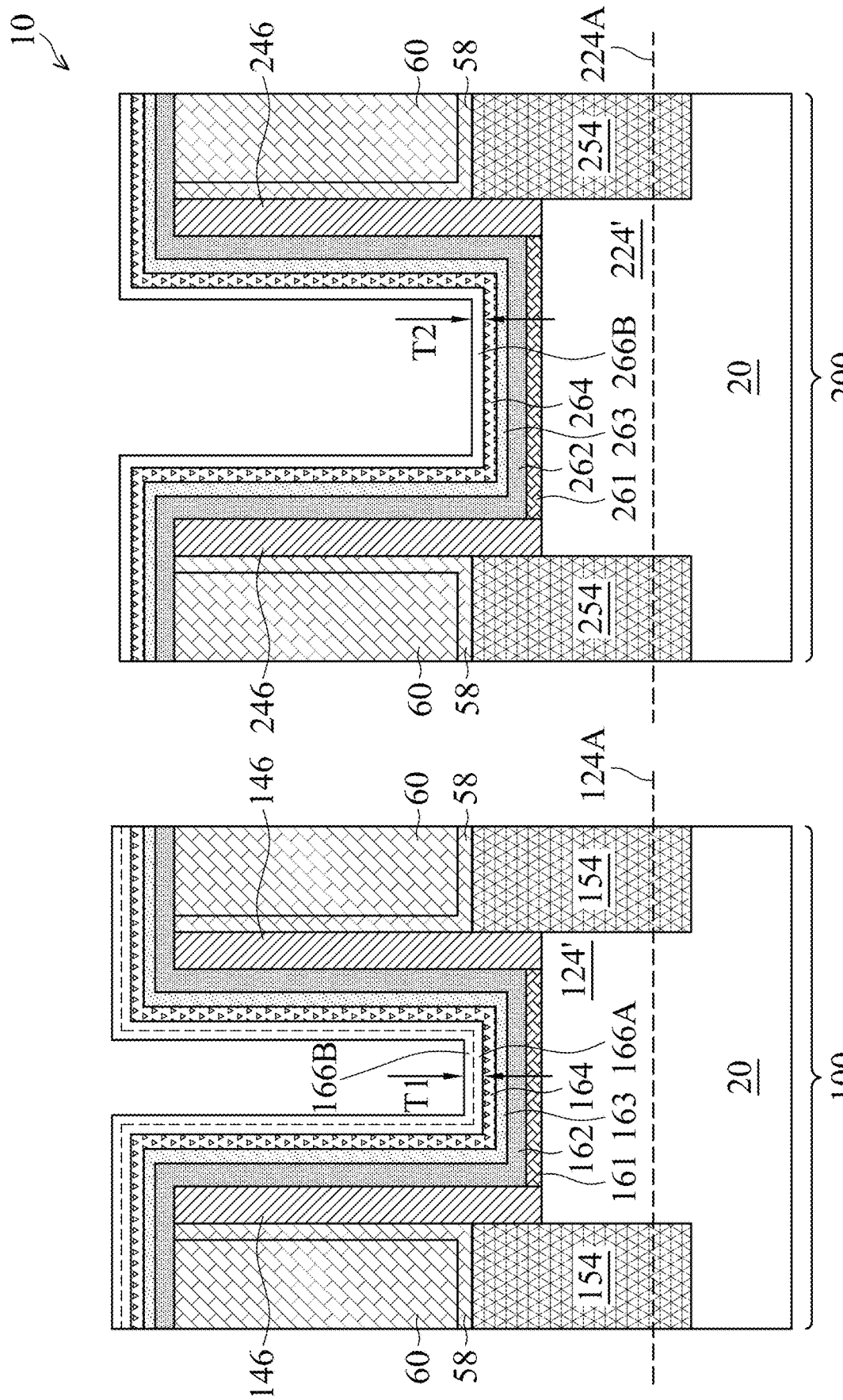

FIG. 19 illustrates the formation of fluorine-blocking layers 166B and 266B, which are formed simultaneously with a same material. The materials and the formation methods of fluorine-blocking layers 166B and 266B may be selected from the candidate materials and the candidate formation methods as in previously discussed embodiments, and hence are not repeated herein. The materials of fluorine-blocking layers 166B and 266B may be the same as or different from the materials of fluorine-blocking layers 166A and 266A. Fluorine-blocking layers 166A and 166B are collectively referred to as fluorine-blocking layers 166. Regardless of whether fluorine-blocking layers 166A and 166B are formed of the same material or different materials, fluorine-blocking layers 166A and 166B may be distinguishable from each other, for example, using TEM.

In accordance with some embodiments of the present disclosure, the thickness of fluorine-blocking layer 166 is in the same range as fluorine-blocking layer 166 as in FIG. 10. Also, the thickness of fluorine-blocking layer 166 is great enough so that most of (for example, more than about 75 percent or 90 percent) fluorine is blocked from reaching the underlying work-function layer 163. The increase (if any) in the threshold voltage caused by the diffused fluorine incorporated into the underlying work-function layer 163 may be smaller than about 0.05 V, for example. On the other hand, the thickness of fluorine-blocking layer 266B is small enough so that fluorine will penetrate through it to reach the underlying work-function layer 263 and cause noticeable increase in the threshold voltage of the resulting FinFET. For example, the increase in the threshold voltage caused by the diffused fluorine incorporated into the underlying work-function layer 263 is greater than about 0.07 V.

In accordance with some embodiments of the present disclosure, the thickness T2 of fluorine-blocking layer 166B is smaller than about 25 Å, and may be in the range between about 5 Å and about 15 Å. The thickness T1 of fluorine-blocking layer 166 is greater than about 15 Å, and may be in the range between about 15 Å and about 30 Å. The thickness ratio T2/T1 is kept in a selected range. When thickness ratio T2/T1 is too big, this either means thickness T2 is too big, which means the threshold voltage of the resulting longer-channel FinFET not increased enough, or thickness T1 is too small, which means the threshold voltage of the resulting shorter-channel FinFET is not suppressed adequately. When thickness ratio T2/T1 is too small, fluorine-blocking layer 266B does not have adequate ability to block the diffusion of fluorine, defeating the purpose of forming fluorine-blocking layer 266B. In accordance with some embodiments, thickness ratio T2/T1 may be in the range between about 0.2 and about 0.8.

Figure 20:
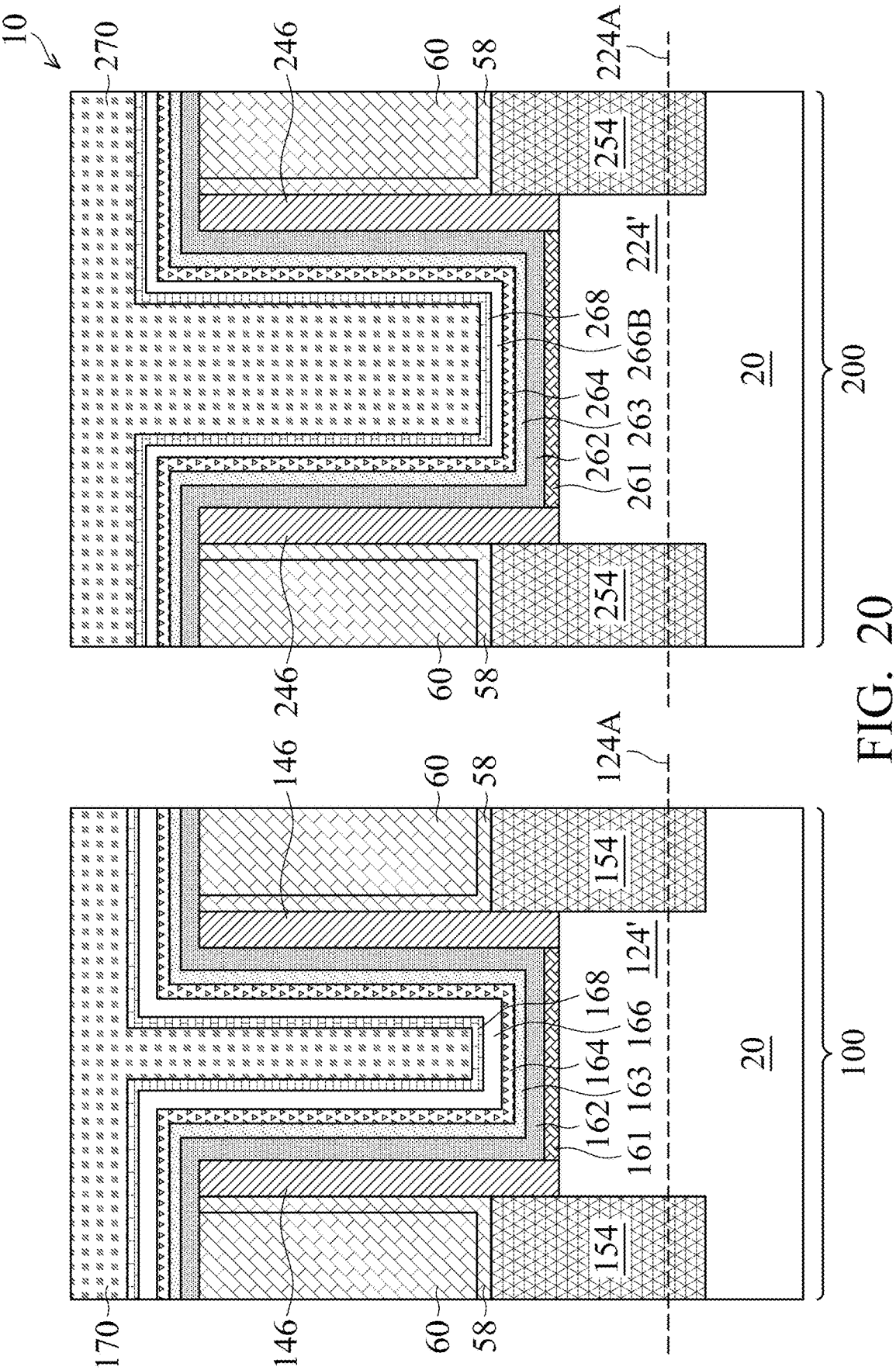
Figure 21:
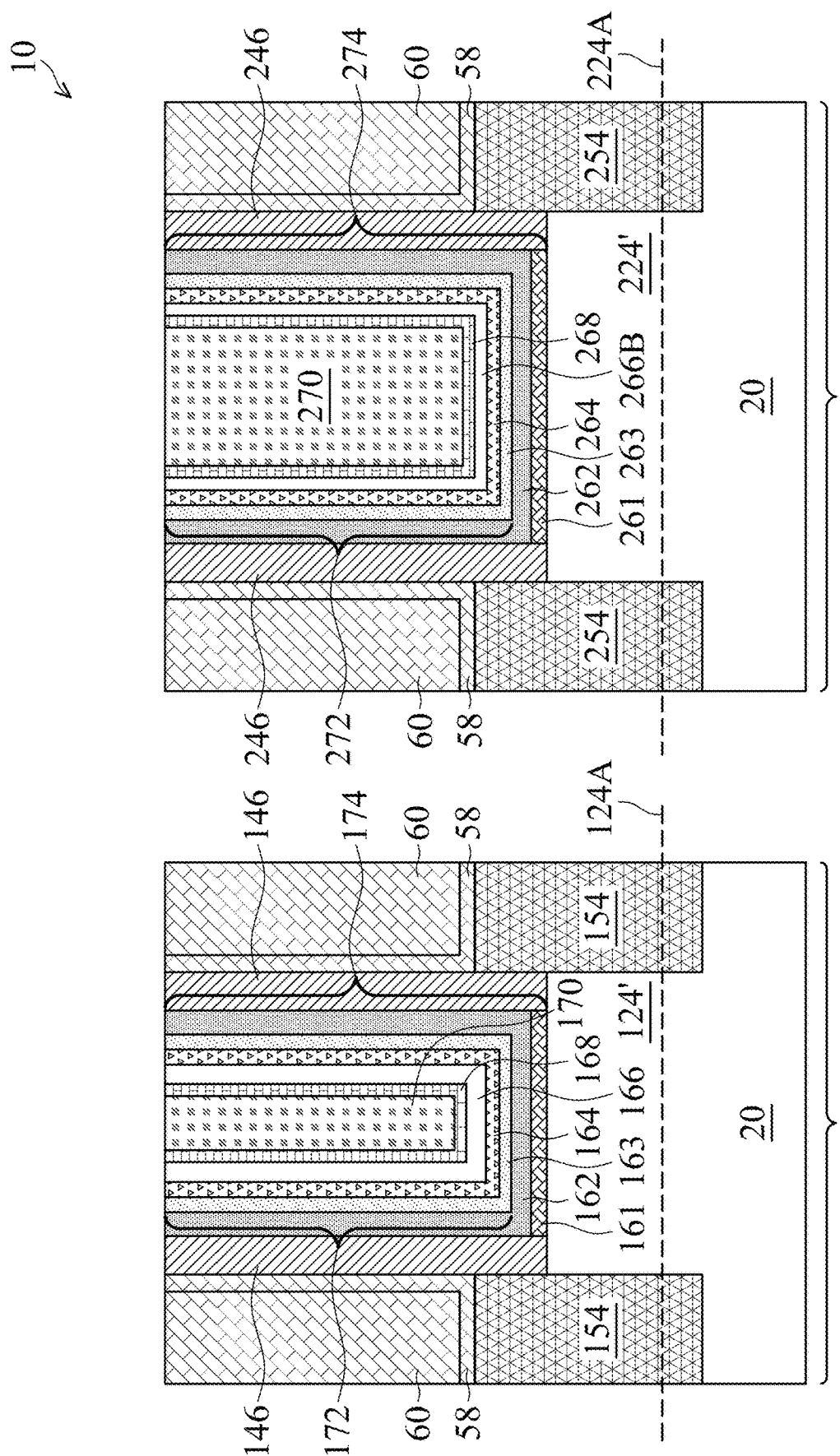
Figure 22:
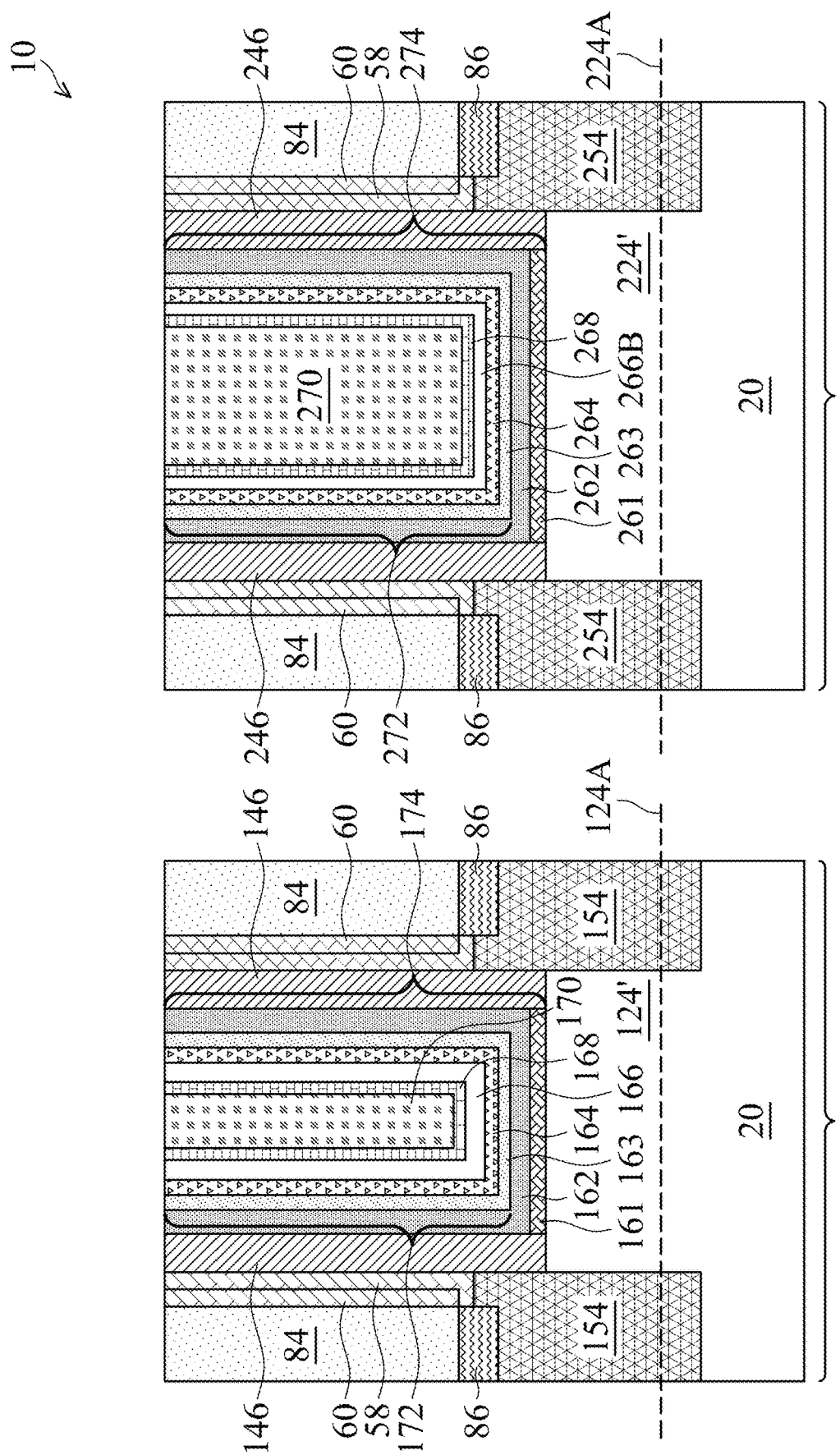
Figure 23:
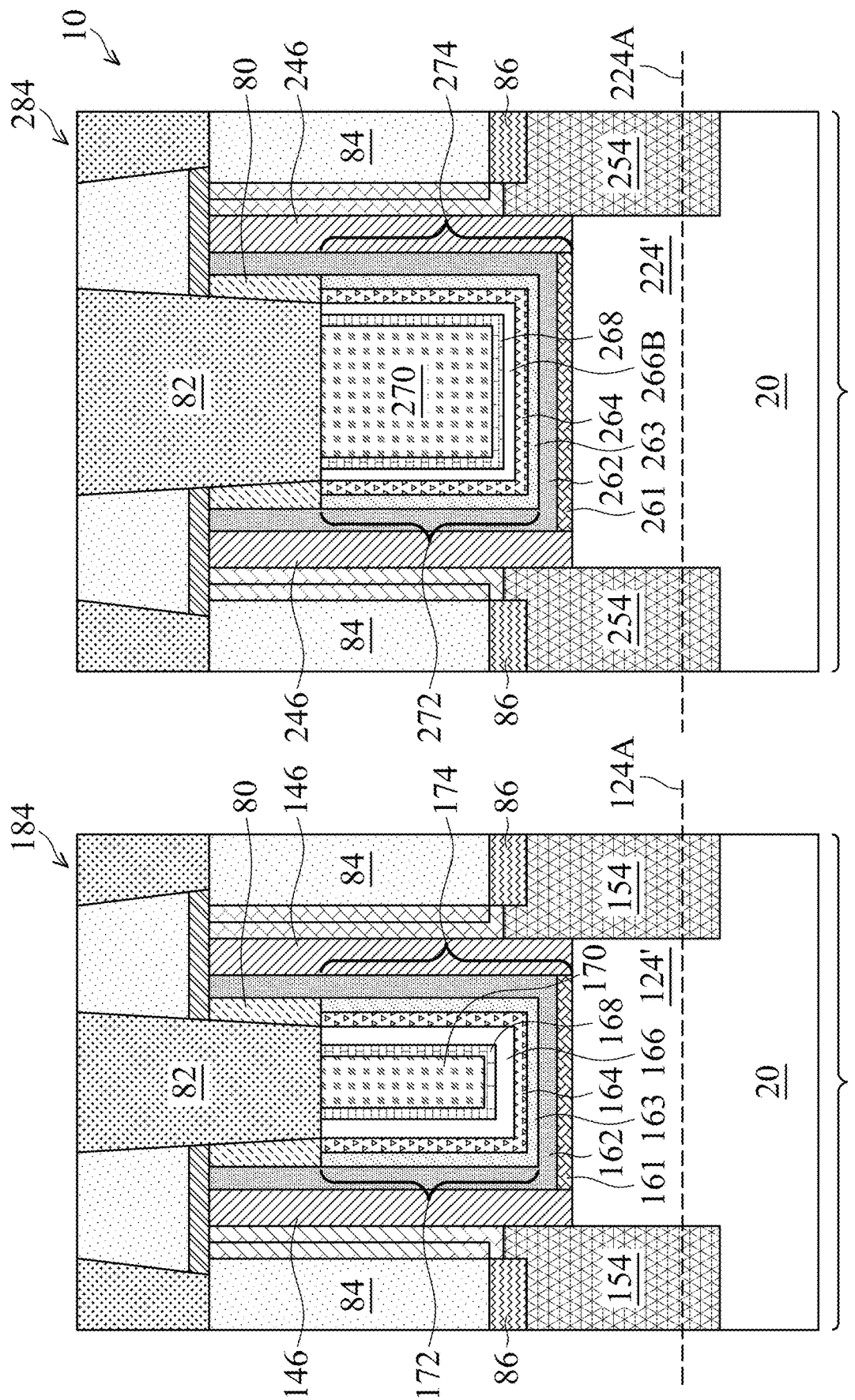

In FIG. 20, nucleation layers 168 and 268 and fluorine-containing metal layers 170 and 270 are formed, followed by a planarization process to form gate electrodes 172 and 272 and the corresponding gate stacks 174 and 274, as shown in FIG. 21. Next, source/drain contact plugs 84 and source/drain silicide regions 86 are formed, as shown in FIG. 22. Gate contact plugs 82 are then formed, as shown in FIG. 23. The materials and the formation processes have been discussed in the preceding embodiments, and are not repeated herein. FinFETs 184 and 284 are thus formed.

Figure 24:
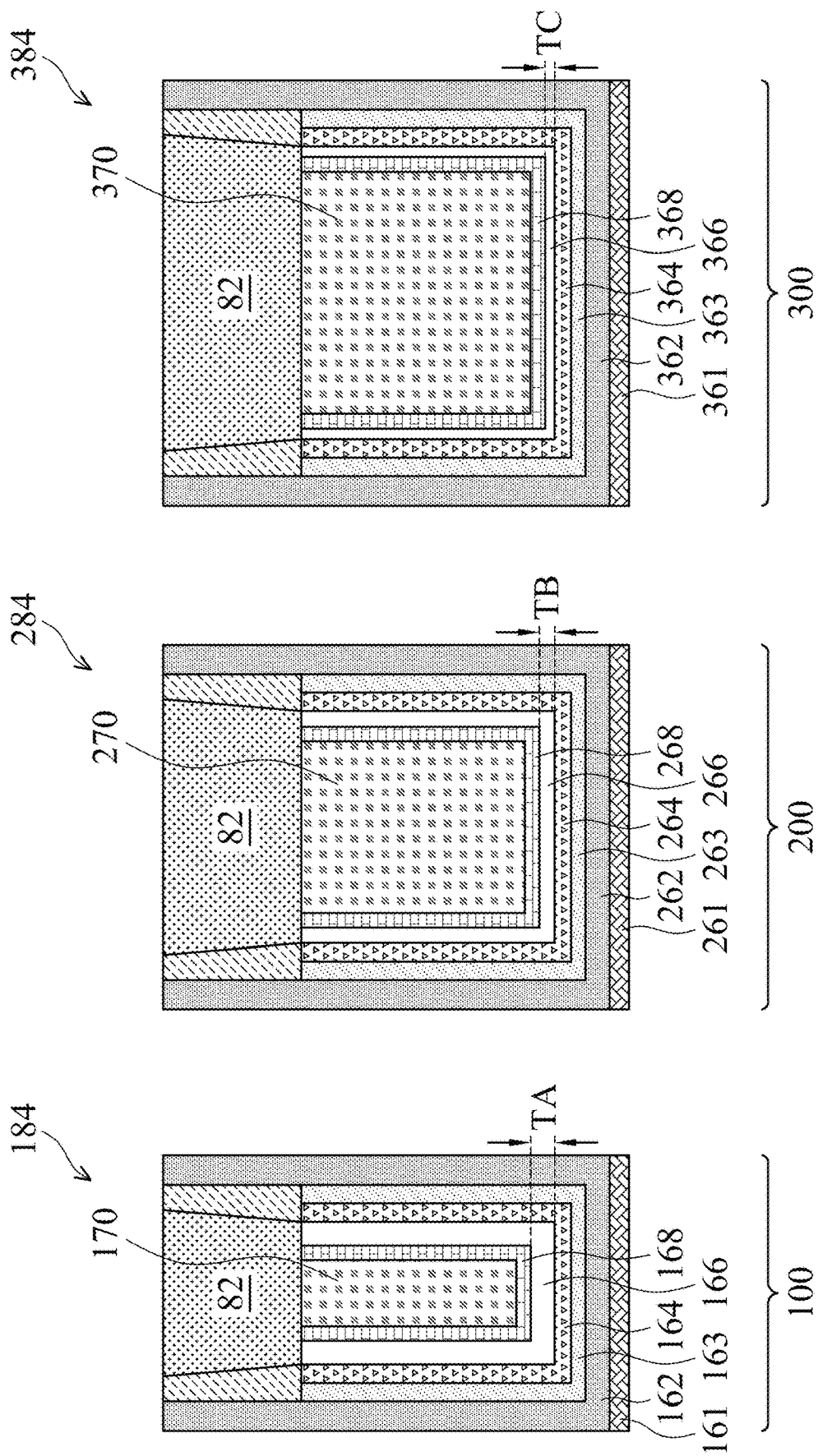
FIGS. 24 and 25 illustrate the cross-sectional views of FinFETs in accordance with some embodiments.

FIG. 24 illustrates FinFETs 184, 284, and 384 formed in three device regions 100, 200, and 300, respectively. Some details such as the source/drain regions of FinFETs 184, 284, and 384 are not shown. Each of FinFETs 184, 284, and 384 may be a short-channel FinFET, a mid-channel FinFET, or a long-channel FinFET, with the channel of FinFET 184 being shorter than the channel of FinFET 284, and the channel of FinFET 284 being shorter than the channel of FinFET 384. For example, FinFETs 184, 284, and 384 may be a short-channel FinFET, a mid-channel FinFET, and a long-channel FinFET, respectively. In accordance with some embodiments of the present disclosure, thickness TA of the fluorine-blocking layer 166 is greater than thickness TB of fluorine-blocking layer 266, and thickness TB of the fluorine-blocking layer 266 is greater than thickness TC of fluorine-blocking layer 366. For example, ratio TB/TA may be in the range between about 0.5 and about 0.8, and ratio TC/TA may be in the range between about 0.2 and about 0.6.

Figure 25:
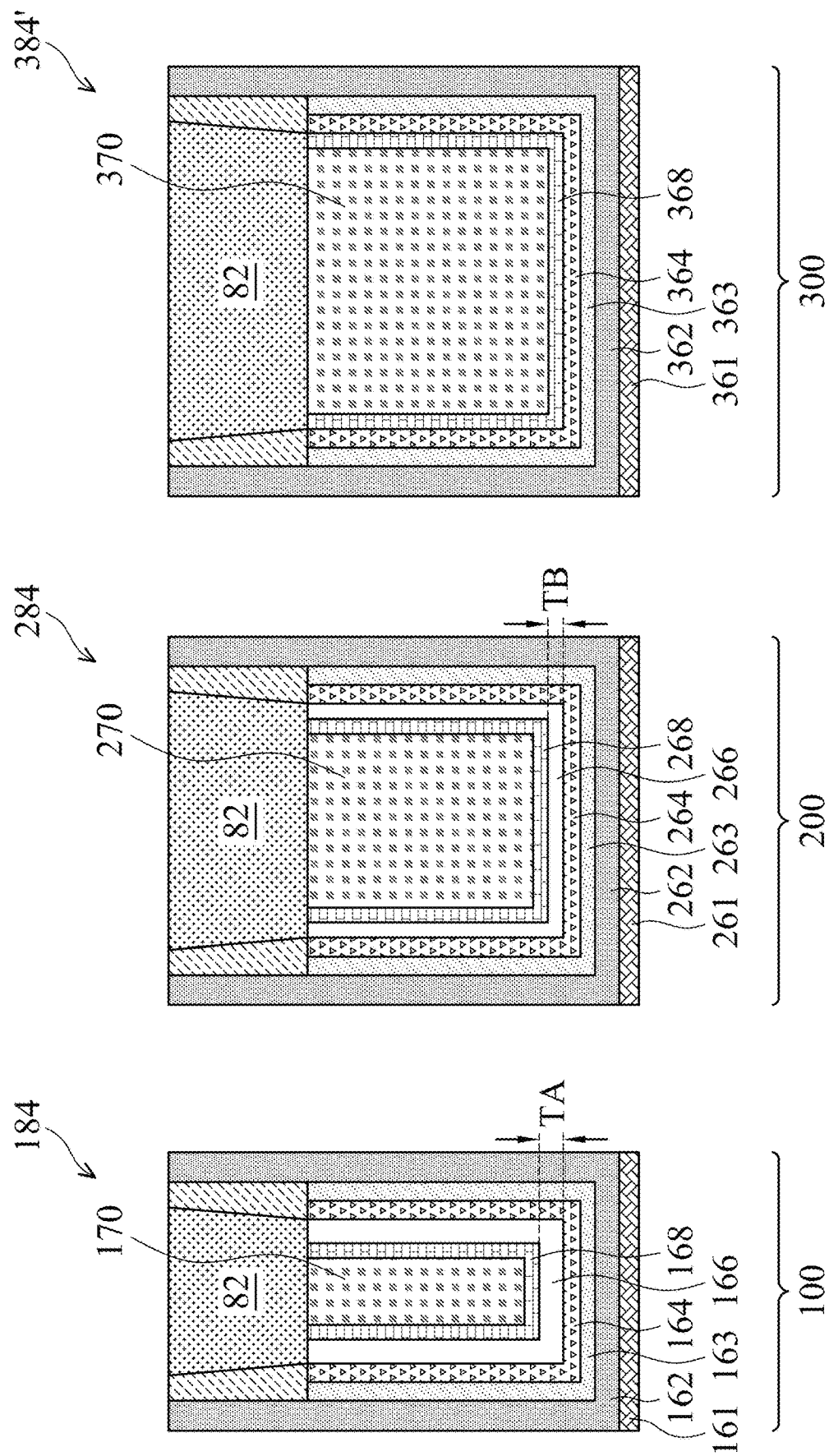

FIG. 25 illustrates FinFETs 184, 284, and 384' in accordance with some embodiments. These embodiments are similar to the embodiments shown in FIG. 24, except there is no fluorine-blocking layer in FinFET 384'.

The embodiments of the present disclosure have some advantageous features. By forming fluorine-blocking layers in shorter-channel transistors, the increase in the respective threshold voltage, which is caused by the diffused fluorine in work-function layer, is substantially eliminated, and the threshold voltages of the shorter-channel transistors may be maintained to be lower. The threshold voltages of the longer-channel transistors are lower than that of the shorter-channel transistors. Accordingly, blocking fluorine diffusion from diffusing into their work-function layers may cause their threshold voltages to be too low. The fluorine-blocking layers in the longer-channel transistors are thus either thinner than in the shorter-channel transistors, or fully removed, so that the threshold voltages of longer-channel FinFETs are not undesirably reduced too much.

In accordance with some embodiments of the present disclosure, a method includes removing dummy gate stacks to form a first recess between first gate spacers and a second recess between second gate spacers, wherein the first gate spacers and the second gate spacers are in a shorter-channel device region and a longer-channel device region, respectively; forming a first work-function layer extending into the first recess, and a second work-function layer extending into the second recess; forming a first fluorine-blocking layer over the first work-function layer, wherein the first fluorine-blocking layer is formed of a fluorine-blocking material; forming a first fluorine-containing metal layer over the first work-function layer, wherein the first fluorine-containing metal layer is formed of a fluorine-containing material; and forming a second fluorine-containing metal layer over the second work-function layer, wherein the second fluorine-containing metal layer and the second work-function layer are either free from the fluorine-blocking material therebetween, or have a second fluorine-blocking layer therebetween, wherein the second fluorine-blocking layer has a thickness smaller than a thickness of the first fluorine-blocking layer. In an embodiment, the method further comprises forming the fluorine-blocking material over the second work-function layer in a common process for forming the first fluorine-blocking layer; and before the forming the second fluorine-containing metal layer, removing the fluorine-blocking material from the longer-channel device region. In an embodiment, the method further comprises forming a first sub fluorine-blocking layer comprising a first portion overlapping the first work-function layer, and a second portion overlapping the second work-function layer; removing the second portion of the first sub fluorine-blocking layer, and leaving the first portion of the first sub fluorine-blocking layer unremoved; and forming a second sub fluorine-blocking layer comprising a first portion overlapping the first work-function layer, and a second portion overlapping the second work-function layer, wherein the first portions of the first and the second sub fluorine-blocking layers in combination form the first fluorine-blocking layer, and the second portion of the second sub fluorine-blocking layer forms the second fluorine-blocking layer. In an embodiment, the forming the first fluorine-containing metal layer comprises depositing a fluorine-free metal layer. In an embodiment, the fluorine-free metal layer comprises tungsten, cobalt, or molybdenum. In an embodiment, the forming the first fluorine-blocking layer comprises depositing a silicon nitride layer, a silicon oxide layer, or an aluminum-based oxide layer. In an embodiment, the forming the second fluorine-containing metal layer comprises: depositing a nucleation layer; and depositing a metal filling region, wherein the nucleation layer and the metal filling region comprise fluorine.

In accordance with some embodiments of the present disclosure, a method includes depositing a first work-function layer and a second work-function layer in a first device region and a second device region, respectively; depositing a first fluorine-blocking layer and a second fluorine-blocking layer in the first device region and the second device region, respectively, wherein the first fluorine-blocking layer is over the first work-function layer, and the second fluorine-blocking layer is over the second work-function layer; removing the second fluorine-blocking layer; and forming a first metal-filling layer over the first fluorine-blocking layer, and a second metal-filling layer over the second work-function layer. In an embodiment, the first work-function layer is comprised in a first transistor comprising a first channel, and the second work-function layer is comprised in a second transistor comprising a second channel, and the first channel is shorter than the second channel. In an embodiment, the first work-function layer and the second work-function layer are formed in a common deposition process. In an embodiment, the first fluorine-blocking layer and the second fluorine-blocking layer are formed in a common deposition process. In an embodiment, the method further comprises depositing a third fluorine-blocking layer and a fourth fluorine-blocking layer in the first device region and the second device region, respectively, wherein the third fluorine-blocking layer is over the first fluorine-blocking layer. In an embodiment, the first metal-filling layer and the second metal-filling layer comprise fluorine. In an embodiment, the depositing the first fluorine-blocking layer and the second fluorine-blocking layer comprises depositing a fluorine-free metal layer.

In accordance with some embodiments of the present disclosure, an integrated circuit device includes a first transistor and a second transistor. The first transistor includes a first work-function layer; a first capping layer over the first work-function layer; a first fluorine-blocking layer over the first capping layer; and a first metal-filling region over the first fluorine-blocking layer, wherein the first metal-filling region comprises fluorine. The second transistor includes a second work-function layer; a second capping layer over the second work-function layer; and a second metal-filling region over and contacting the second capping layer, wherein the second metal-filling region comprises fluorine. In an embodiment, the first capping layer and the second capping layer are formed of a same material, and the first metal-filling region and the second metal-filling region are formed of a same material. In an embodiment, the first fluorine-blocking layer is free from fluorine, and the first fluorine-blocking layer comprises tungsten, cobalt, or molybdenum. In an embodiment, the first fluorine-blocking layer has a thickness greater than about 15 Å. In an embodiment, the first metal-filling region and the second metal-filling region comprise fluorine. In an embodiment, the second capping layer comprises TiN.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
  removing a first dummy gate stack to form a first recess between first gate spacers;
  depositing a first work-function layer extending into the first recess;

depositing a first tungsten layer overlapping the first work-function layer and extending into the first recess;

removing the first tungsten layer to reveal an underlying layer; and forming a tungsten region in the first recess, wherein the tungsten region is over and electrically connected to the underlying layer.

2. The method of claim 1 further comprising, after the first tungsten layer is deposited, depositing a second tungsten layer over the underlying layer, wherein the tungsten region is deposited over the second tungsten layer.

3. The method of claim 2, wherein the first tungsten layer and the second tungsten layer are formed using fluorine-free precursors, and wherein the tungsten region is formed using a fluorine-containing precursor.

4. The method of claim 1 further comprising depositing a titanium nitride layer as the underlying layer, wherein the titanium nitride layer is over the first work-function layer.

5. The method of claim 1 further comprising:

removing a second dummy gate stack to form a second recess between second gate spacers;

when the first work-function layer is deposited, simultaneously depositing a second work-function layer extending into the second recess; and when the first tungsten layer is deposited, simultaneously depositing a third tungsten layer overlapping the second work-function layer and extending into the second recess, wherein when the first tungsten layer is removed, the third tungsten layer is protected from being removed.

6. The method of claim 1, wherein after the tungsten region is formed, the first recess is fully filled.

7. The method of claim 1, wherein the first tungsten layer is formed using a first precursor selected from WCl, WBr, WCN, and combinations thereof, and the tungsten region is formed using $WF_6$ as a second precursor.

8. The method of claim 1, wherein the first tungsten layer further comprises cobalt or molybdenum alloyed with tungsten.

9. The method of claim 1, wherein the forming the tungsten region comprises:

depositing a tungsten nucleation layer; and depositing an additional tungsten layer to fully fill the first recess, wherein the tungsten nucleation layer and the additional tungsten layer comprise fluorine.

10. A method comprising:

forming a transistor comprising:

depositing a work-function layer over a semiconductor region;

depositing a capping layer over the work-function layer;

depositing a fluorine-blocking layer over the capping layer;

removing the fluorine-blocking layer; and forming a metal-filling layer over the capping layer, wherein the metal-filling layer comprises a same metal as the fluorine-blocking layer.

11. The method of claim 10, wherein at a time the metal-filling layer is formed, the work-function layer remains.

12. The method of claim 10, wherein the same metal comprises tungsten.

13. The method of claim 10, wherein the same metal comprises cobalt.

14. The method of claim 10, wherein the same metal comprises molybdenum.

15. The method of claim 10, wherein the fluorine-blocking layer is formed using a fluorine-free precursor, and the metal-filling layer is formed using a precursor comprising fluorine.

16. The method of claim 10, wherein the fluorine-blocking layer has a density higher than about 8 $g/cm^3$.

17. A method comprising:

depositing a work-function layer comprising titanium and aluminum;

forming a titanium nitride layer over the work-function layer;

forming a first tungsten layer over and in physical contact with the titanium nitride layer;

removing the first tungsten layer through etching, with the titanium nitride layer used as an etch stop layer; and forming a second tungsten layer over the titanium nitride layer.

18. The method of claim 17, wherein the first tungsten layer is free from fluorine when deposited, and the second tungsten layer contains fluorine when deposited.

19. The method of claim 17, wherein the first tungsten layer comprises a crystalline structure.

20. The method of claim 17 further comprising, after the first tungsten layer is removed depositing a third tungsten layer over the titanium nitride layer, wherein the second tungsten layer is formed over the third tungsten layer, and wherein both of the first tungsten layer and the third tungsten layer are free from fluorine when deposited, and the second tungsten layer contains fluorine when deposited.

* * * * *